(12) United States Patent
Matsuda

(10) Patent No.: US 9,743,532 B2
(45) Date of Patent: Aug. 22, 2017

(54) FLEXIBLE PRINTED CIRCUIT BOARD AND MANUFACTURING METHOD OF FLEXIBLE PRINTED CIRCUIT BOARD

(71) Applicant: NIPPON MEKTRON, LTD., Minato-ku, Tokyo (JP)

(72) Inventor: Fumihiko Matsuda, Tokyo (JP)

(73) Assignee: NIPPON MEKTRON, LTD., Minato-Ku, Tokyo (JP)

( * ) Notice: Subject to any disclaimer, the term of this patent is extended or adjusted under 35 U.S.C. 154(b) by 140 days.

(21) Appl. No.: 14/870,687

(22) Filed: Sep. 30, 2015

(65) Prior Publication Data

US 2016/0020500 A1    Jan. 21, 2016

Related U.S. Application Data

(63) Continuation-in-part of application No. PCT/JP2014/082978, filed on Dec. 12, 2014.

(30) Foreign Application Priority Data

Jun. 16, 2014  (JP) .................................. 2014-123753

(51) Int. Cl.
```
H01P 3/08     (2006.01)
H05K 1/02     (2006.01)
H05K 3/00     (2006.01)
H05K 3/42     (2006.01)
H01P 11/00    (2006.01)
H05K 1/11     (2006.01)
```
(52) U.S. Cl.
CPC .............. *H05K 3/42* (2013.01); *H01P 3/085* (2013.01); *H05K 1/0225* (2013.01); *H05K 1/028* (2013.01);
(Continued)

(58) Field of Classification Search
CPC ........ H05K 3/42; H05K 1/0225; H05K 1/028; H05K 2201/09681; H01P 3/085
(Continued)

(56) References Cited

U.S. PATENT DOCUMENTS 5,633,479 A     5/1997  Hirano
2012/0326813 A1* 12/2012 Wong ...................... H01P 3/121
                                                            333/241
(Continued)

FOREIGN PATENT DOCUMENTS

JP      64045190 A    2/1989
JP      08057792 A    3/1996
(Continued)

OTHER PUBLICATIONS

International Search Report corresponding to Application No. PCT/JP2014/082978; Date of Mailing: Mar. 3, 2015.
(Continued)

*Primary Examiner* — Stephen E Jones
*Assistant Examiner* — Scott S Outten
(74) *Attorney, Agent, or Firm* — Cantor Colburn LLP

(57) ABSTRACT

A flexible printed circuit board having at least a set of strip line transmission path by being provided with a signal line, and a pair of ground layers and, includes a pleated part PL having a plurality of curved portions which are curved so as to be opened or closed, in which in the ground layers, mesh ground layers in which conductive portions are provided in a mesh shape, and solid ground layers in which the conductive portions are provided in a planar state, are provided, in which the mesh ground layers are arranged on an outer peripheral side of the curved portions PL2, and the solid ground layers are arranged on an inner peripheral side of the curved portions.

10 Claims, 15 Drawing Sheets

(52) U.S. Cl.
CPC ............... *H05K 2201/0129* (2013.01); *H05K 2201/09681* (2013.01)

(58) Field of Classification Search
USPC .......................................... 333/238
See application file for complete search history.

(56) References Cited

U.S. PATENT DOCUMENTS

2014/0176266 A1\* 6/2014 Kato .................. H01P 3/08
333/238
2015/0342030 A1\* 11/2015 Watanabe ............ H05K 1/0216
174/268

FOREIGN PATENT DOCUMENTS

| | | |
|---|---|---|
| JP | 2009176901 A | 8/2009 |
| JP | 2011233822 A | 11/2011 |
| JP | 2012231018 A | 11/2012 |
| JP | 2014011012 A | 1/2014 |
| TW | 278311 B | 6/1996 |
| TW | 201041459 A | 11/2010 |

OTHER PUBLICATIONS

Taiwanese Office Action corresponding to Application No. 104119332; Issue date: Oct. 24, 2016, with English abstract.

\* cited by examiner

FLEXIBLE PRINTED CIRCUIT BOARD AND MANUFACTURING METHOD OF FLEXIBLE PRINTED CIRCUIT BOARD

CROSS REFERENCE TO RELATED APPLICATIONS

This application is a continuation in part application under 35 U.S.C. §120 of PCT/JP2014/082978, filed Dec. 12, 2014 which is incorporated herein reference and which claimed priority to Japanese Application No. 2014-123753, filed Jun. 16, 2014. The present application likewise claims priority under 35 U.S.C. §119 to Japanese Application No. 2014-123753, filed Jun. 16, 2014, the entire content of which is also incorporated herein by reference.

TECHNICAL FIELD

The present invention relates to a flexible printed circuit board and a manufacturing method of a flexible printed circuit board.

BACKGROUND ART

In recent years, development in robots is remarkable such that robots performing a variety of motions are appearing. Further, a wearable electronic device capable of being attached to a human body or clothing is also being developed and put to practical use in various devices. Although, in these robots and wearable electronic devices, a large number of electric wires for power supply and for transmission of electrical signals are used, in general, an electric wire is structured such that a copper wire is used as a core, and an outer periphery of the copper wire is covered by an insulator, so that the electric wire itself does not have extension/contraction property almost at all. For this reason, in a robot or the like, there is a need to provide a margin to a length of electric wire so as not to prevent a motion and the like of a joint of the robot or the like, which becomes an obstacle in terms of design and practical use for downsizing, reduction in weight and the like.

Particularly, when a front-line humanoid-type robot, a power assist device which is attached to a human body to assist muscular power, or the like is used, a large number of electric wires for moving a terminal motor via multiple-degree-of-freedom joints and a large number of electric wires for transmitting electrical signals from various types of sensors disposed at terminal end are wired. Further, in order to increase a degree of freedom of these wires in the multiple-degree-of-freedom joints, a demand with respect to electric wires configured in an extendable/contractable manner is increasing.

Meanwhile, arm robots are often used as industrial robots in recent years. In this type of arm robots, depending on a drive system of an end effector (which is equivalent to a hand in a human body) attached to a tip side of the robot arm and a joint part of the robot arm, there is sometimes generated a necessity to arrange, other than electric cables, an air hose for application of pneumatic pressure or a hydraulic hose from a root side to the tip side of the robot arm. When such cables and hoses are arranged in a joint part, there is a chance that bending or disconnection of the cables occurs. Accordingly, there is adopted a wiring method such that the cables and the hoses are once taken out to the outside at a position on a base end side relative to a joint part of the robot arms, the cables are arranged in an outside space of the joint part, and then introduced again into the arm at a position on a tip side relative to the joint part. However, in the method of arranging the cables in the outside space of the robot arm, it becomes required to provide the space for slackening the cables to the periphery of the joint part of the robot arm.

Further, PTL1, for example, discloses a structure in which a support rod is provided at a rotation center position of joint in a joint part of a robot arm, a cable is wound around the support rod, and the support rod around which the cable is previously wound is housed in the inside of the robot arm, thereby preventing bending or disconnection of the cable. However, there is a chance of causing a reduction in functions (operating speed, accuracy and the like) due to an increase in weight caused by separately providing the support rod. There is sometimes a case where a motor or the like with high specification is used or a number of required members is increased for compensating the reduction in functions, but, in that case, a manufacturing cost is increased. Besides, a structure of a housing part of the cable becomes complicated, so that there is a problem that a work when performing wiring of the cable during an assembly of the robot arm, and when performing disassembly in the case of maintenance or the like, in which the cable is taken out and exchanged, becomes complicated very much. From this point, also in the robot arm, a demand with respect to an extendable/contractable electrical transmission member which can avoid such a problem, is increasing.

As a technique which responds to such a requirement with respect to the electrical transmission member, there is one disclosed in PTL2, for example. Such PTL2 describes a method in which a plurality of pieces of pins each formed to have a desired R are arranged in a jig at an interval at which a flexible printed circuit board can be passed, and heat-molding is performed by passing the flexible printed circuit board while applying a constant tension to the jig.

Further, regarding the structure of the flexible printed circuit board, PTL2 discloses not only a single-sided flexible printed circuit board having a conductive layer only on its one side, but also a three-layer flexible printed circuit board having conductive layers formed of three layers. The three-layer flexible printed circuit board is generally used for a so-called strip line transmission path in which a signal line having matched characteristic impedance is arranged on an inner layer, and an outer layer is set as GND (ground). The three-layer flexible printed circuit board is required when, for example, an image sensor is attached to a tip side of the aforementioned movable part, and large-capacity data such as high-definition moving image data is transmitted via an extendable/contractable flexible printed circuit board, in which it is aimed to block a noise from the outside and to realize both of high-quality signal transmission and extension/contraction property.

Further, PTL3 discloses a configuration in which a ground of an outer layer of a flexible printed circuit board is not set to a solid GND in a solid state but is set to have a mesh structure, to thereby reduce a generation of stress concentration with respect to a bent portion.

CITATION LIST

Patent Literature

{PTL 1} JP H08-57792 A
{PTL 2} JP 2011-233822 A
{PTL 3} JP 2009-176901 A

SUMMARY OF INVENTION

Technical Problem

Incidentally, in the strip line transmission path as disclosed in PTL2, the outer layer is the solid GND, and further, a plating coating film exists on the outer layer. Accordingly, the strip line transmission path is hard as the flexible printed circuit board. For this reason, a followability with respect to the jig is also poor, and thus it is difficult to perform molding into a pleated shape in which a plurality of bent portions exist. Particularly, a bending stress when performing the molding into the pleated shape is large on the outer layer side, and further, there is a high possibility that a disconnection occurs, due to extensions/contractions performed 1000 times or less, at a bent portion in the pleated shape. Accordingly, there is a need to exchange the disconnected flexible printed circuit board at frequent intervals, which requires a maintenance cost. Further, when the above-described flexible printed circuit board is used in production facilities, there is a problem that the production has to be stopped due to the disconnection.

Accordingly, it can be considered to design such that, in the strip line transmission path as disclosed in PTL2, the outer layer of the flexible printed circuit board is set to have the mesh structure, as disclosed in PTL3. However, when the configuration of PTL3 is applied to the configuration of PTL2, signal lines come close to each other at portions which form the pleated shape. Further, there is a possibility that an electrical interference occurs due to the proximity, and the characteristic impedance fluctuates.

The present invention is made based on the above-described circumstances, and an object thereof is to provide a flexible printed circuit board in which a disconnection does not easily occur even when it is repeatedly extended/contracted under a state of maintaining an electrical characteristic, and a manufacturing method of the flexible printed circuit board.

Solution to Problem

In order to solve the above-described problems, according to a first aspect of the present invention, there is provided a flexible printed circuit board being a flexible printed circuit board having at least a set of strip line transmission path by being provided with a signal line, insulating layers covering the signal line from both sides and each made of a thermoplastic resin as its material, and a pair of ground layers facing the signal line with the respective insulating layers sandwiched therebetween, characterized in that it includes a pleated part having curved portions molded at a plurality of positions thereof, the curved portions being curved so as to be opened or closed, in which in the ground layers, mesh ground layers in which conductive portions exist to surround openings so that the conductive portions are provided in a mesh shape, and solid ground layers in which the conductive portions are provided in a planar state, are provided, in which the mesh ground layers are arranged on an outer peripheral side of the curved portions, and the solid ground layers are arranged on an inner peripheral side of the curved portions.

Further, in another aspect of the present invention, it is preferable that in the above-described invention, directions of curves of the curved portions are alternately switched to provide the pleated part to have a bellows shape, and the mesh ground layers are arranged on the outer peripheral side of the curved portions in a state of existing on a front surface side and a rear surface side of the signal line, in an alternate manner.

Further, in another aspect of the present invention, it is preferable that in the above-described invention, directions of curves of the curved portions are alternately switched to provide the pleated part to have a bellows shape, and the mesh ground layers are arranged on the outer peripheral side of the curved portions in a state of existing on either a front surface side or a rear surface side of the signal line.

Further, in another aspect of the present invention, it is preferable that in the above-described invention, the insulating layer is formed by using LCP (Liquid Crystal Polymer) being the thermoplastic resin as its material.

Further, in another aspect of the present invention, it is preferable that in the above-described invention, a plating coating film for interlayer connection is not formed on the ground layers positioned at the curved portions.

Further, according to a second aspect of the present invention, there is provided a manufacturing method of a flexible printed circuit board having at least a set of strip line transmission path by being provided with a signal line, insulating layers covering the signal line from both sides and each made of a thermoplastic resin as its material, and a pair of ground layers facing the signal line with the respective insulating layers sandwiched therebetween, characterized in that it includes: a first step of forming at least one of the signal line on, in a double-sided copper-clad laminate having base copper foil layers on both surfaces of the insulating layer, the base copper foil layer of one surface side; a second step of laminating, via a lamination adhesive material, a single-sided copper-clad laminate having a base copper-clad laminate on one side of the insulating layer; a third step of forming through holes on predetermined portions of an intermediate product formed through the second step; a fourth step of forming conductive through holes by forming conductive coating films on the through holes and a periphery of openings of the through holes; a fifth step of performing patterning on the base copper foil layers facing the signal line in an intermediate product formed through the fourth step, to form, on a side of either one surface, mesh ground layers in which conductive portions exist to surround openings, and to form, on a side of surface opposite to the one surface, solid ground layers in which the conductive portions are provided in a planar state; a sixth step of covering at least curved portions to be curved after performing heat-molding, in the mesh ground layers and the solid ground layers, with insulating resin layers via adhesive material layers; and a seventh step of performing, on a flexible printed circuit board before being subjected to the heat-molding formed through the sixth step, the heat-molding in a state where a plurality of portions are curved, and forming, after the heat-molding, a pleated part in which a plurality of curved portions having the mesh ground layers positioned on an outer peripheral side thereof exist.

Advantageous Effects of Invention

The present invention can create a state where a disconnection does not easily occur in a flexible printed circuit board even if the flexible printed circuit board is repeatedly extended/contracted under a state of maintaining an electrical characteristic.

DESCRIPTION OF EMBODIMENTS

Hereinafter, a flexible printed circuit board 10 related to one embodiment of the present invention will be described as follows. The following explanation is sometimes made by using an XYZ orthogonal coordinate system. In the above, an X direction is set to a longitudinal direction of the flexible printed circuit board 10, in which an X1 side and an X2 side are set to a right side and a left side, respectively, in FIG. 1. Further, a Y direction is set to a width direction of the flexible printed circuit board 10, in which a Y1 side and a Y2 side are set to a front side of the paper surface and a rear side of the paper surface, respectively, in FIG. 1. Further, a Z direction is set to a thickness direction of the flexible printed circuit board 10, in which Z1 and Z2 are set to a rear side of the paper surface and a front side of the paper surface, respectively, in FIG. 2.

Regarding Flexible Printed Circuit Board

Figure 1:
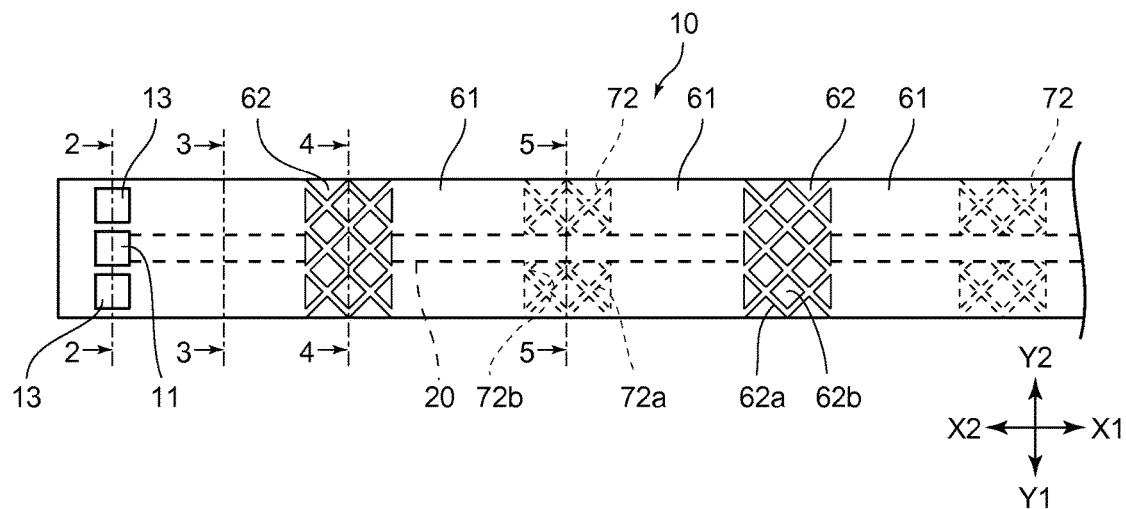
FIG. 1 is a plan view related to one embodiment of the present invention, and illustrating a configuration of a flexible printed circuit board of a first configuration example before molding.
Figure 2:
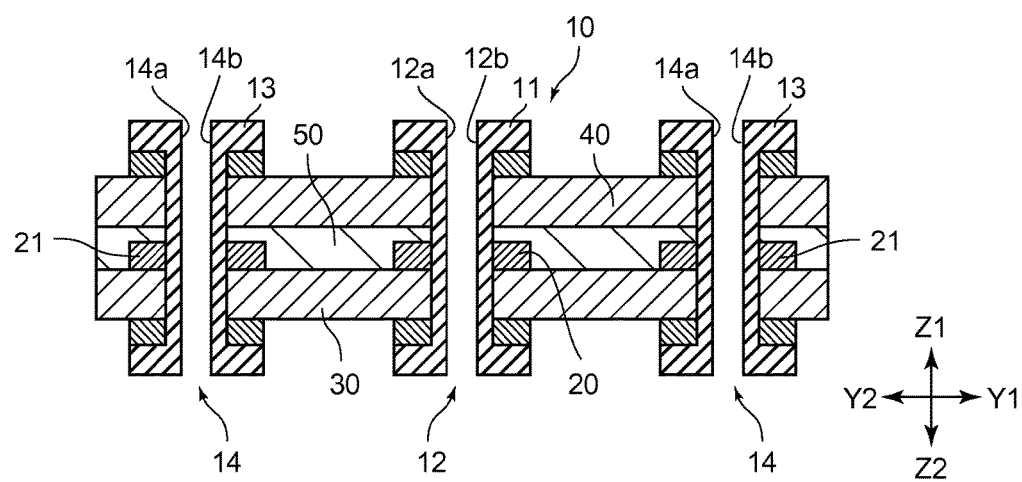
FIG. 2 is a sectional view of the flexible printed circuit board before and after the molding, and a view illustrating a state where the board is cut along the line 2-2 in FIG. 1.
Figure 3:
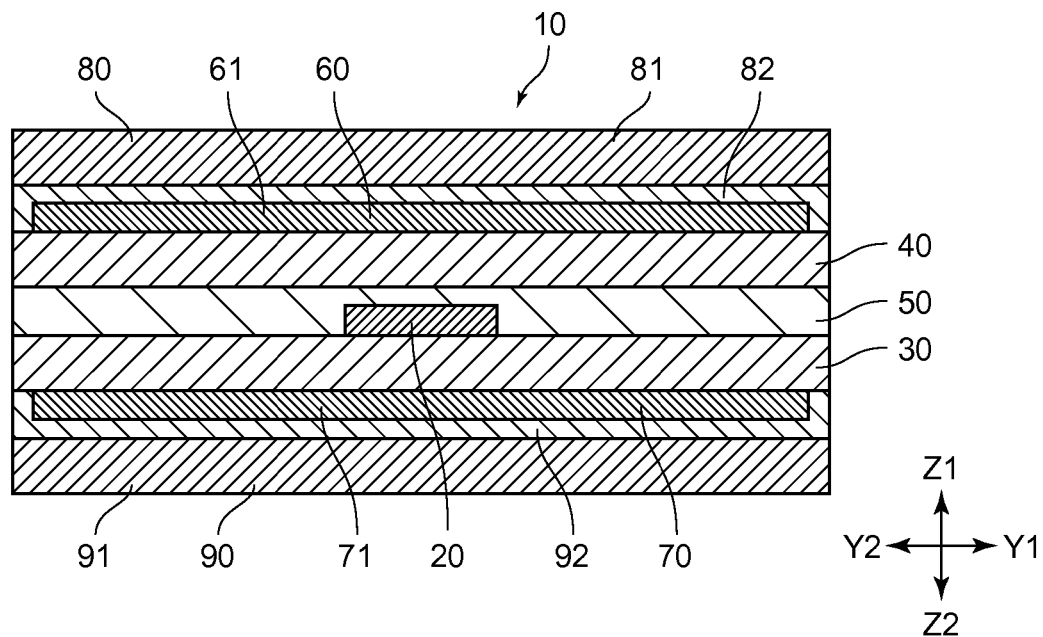
FIG. 3 is a sectional view of the flexible printed circuit board before and after the molding, and a view illustrating a state where the board is cut along the line 3-3 in FIG. 1.
Figure 4:
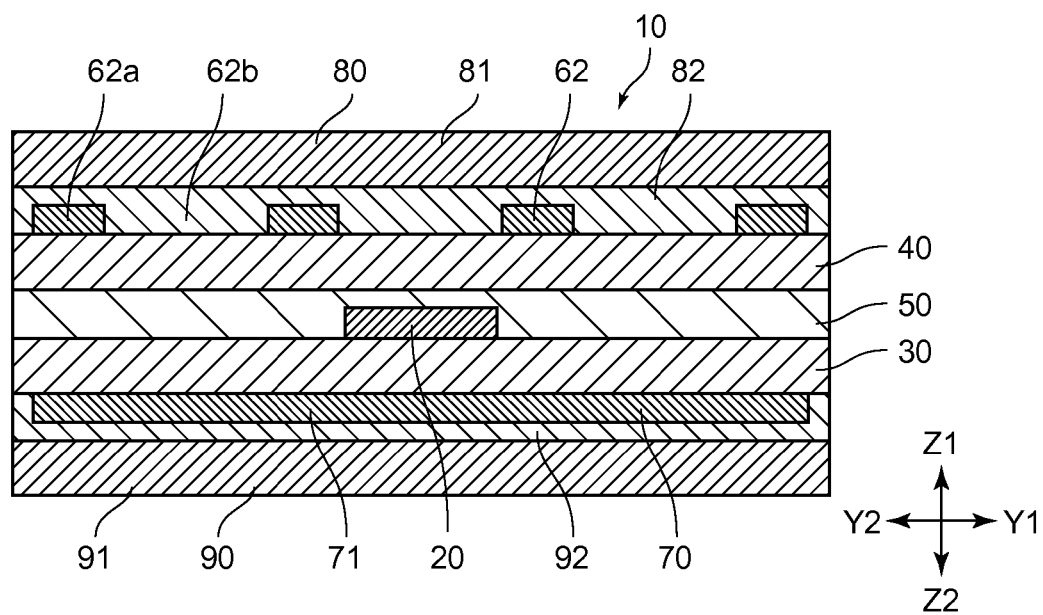
FIG. 4 is a sectional view of the flexible printed circuit board before and after the molding, and a view illustrating a state where the board is cut along the line 4-4 in FIG. 1.
Figure 5:
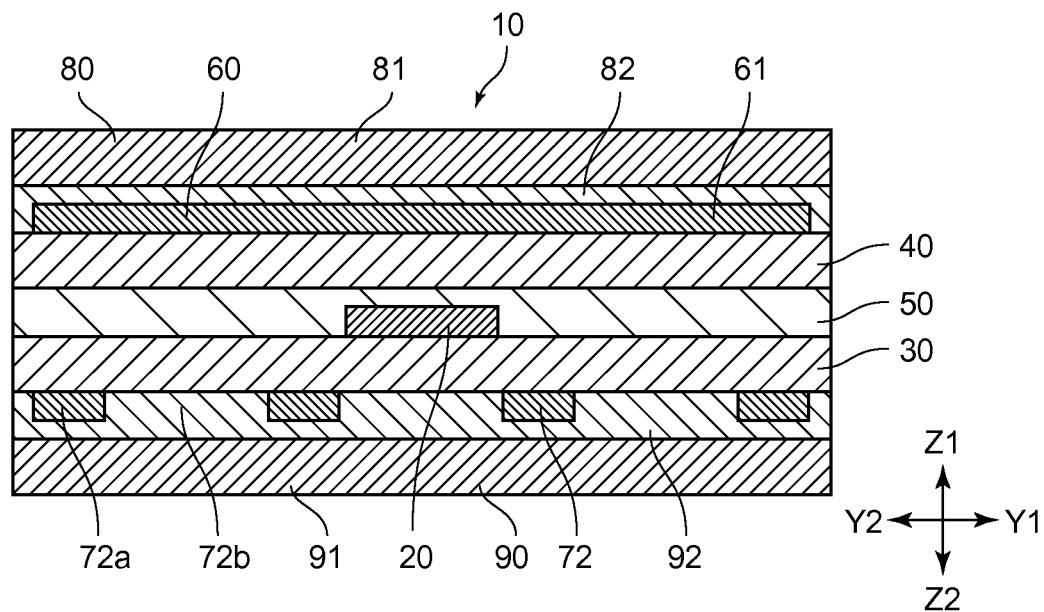
FIG. 5 is a sectional view of the flexible printed circuit board before and after the molding, and a view illustrating a state where the board is cut along the line 5-5 in FIG. 1.

FIG. 1 is a plan view illustrating a configuration of the flexible printed circuit board 10 before molding. FIG. 2 is a sectional view of the flexible printed circuit board 10 before and after the molding, and a view illustrating a state where the board is cut along the line 2-2 in FIG. 1. FIG. 3 is a sectional view of the flexible printed circuit board 10 before and after the molding, and a view illustrating a state where the board is cut along the line 3-3 in FIG. 1. FIG. 4 is a sectional view of the flexible printed circuit board 10 before and after the molding, and a view illustrating a state where the board is cut along the line 4-4 in FIG. 1. FIG. 5 is a sectional view of the flexible printed circuit board 10 before and after the molding, and a view illustrating a state where the board is cut along the line 5-5 in FIG. 1.

As illustrated in FIG. 1 to FIG. 5, the flexible printed circuit board 10 in the present embodiment is a three-layer flexible printed circuit board being one kind of multilayer flexible printed circuit board, and has a configuration in which three layers of conductive parts exist. Concretely, the flexible printed circuit board 10 has a signal line 20 on its inner layer side. The signal line 20 corresponds to a part formed by removing a copper foil portion which transmits a signal, by etching or the like with the use of a manufacturing method as will be described later, so as to match a characteristic impedance for high-speed transmission.

Figure 6:
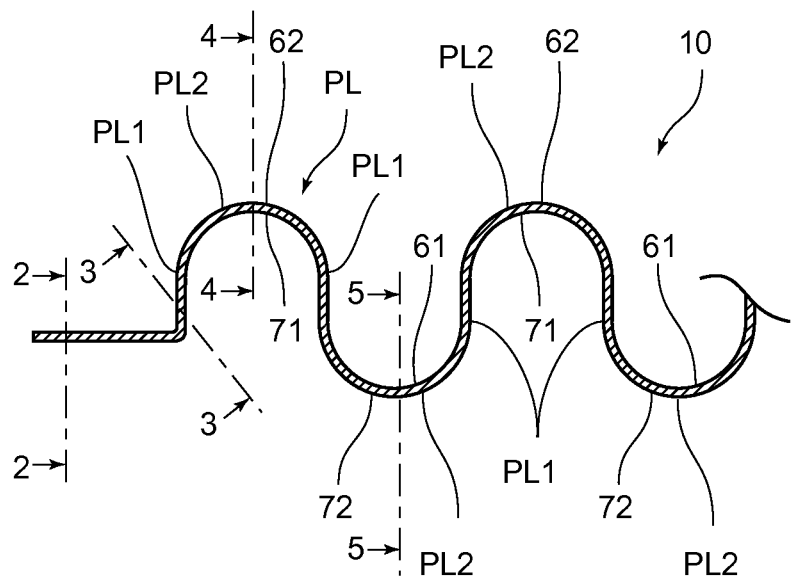
FIG. 6 is a side view illustrating a shape of the flexible printed circuit board after the molding.

Note that as illustrated in FIG. 1, the flexible printed circuit board 10 is provided to have a long narrow shape. In the present embodiment, the flexible printed circuit board 10 has, for example, a width (dimension in the Y direction) of 5 mm, and a length before molding (dimension in the X direction) of 400 mm. Note that when the flexible printed circuit board 10 is molded into a pleated shape (bellows shape) so that a radius of a curved portion PL2 becomes 1 mm, as illustrated in FIG. 6 which will be described later, the length becomes about 150 mm, for example. However, the example of dimension is not limited to this, and the flexible printed circuit board 10 can be set to have various dimensions (which similarly applies to an example of dimension to be described later).

Further, as illustrated in FIG. 1, the flexible printed circuit board 10 is provided with a signal pad 11 exposed to a front and a rear thereof. Specifically, the signal pad 11 is not covered by cover layers 80 and 90 to be described later, and is exposed to the outside on the front surface side and the rear surface side, respectively. The signal pad 11 corresponds to a part for inputting or outputting a signal into or from the signal line 20 by being subjected to electrical interlayer connection with respect to the signal line 20. Accordingly, to the signal pad 11, a conductive through hole 12 is electrically connected. The conductive through hole 12 has a through hole 12a passing through the flexible printed circuit board 10, and a conductive coating film 12b of plating or the like formed on an inner wall side of the through hole 12a, and the signal pad 11 is electrically connected to the signal line 20 via the conductive coating film 12b.

Further, the flexible printed circuit board 10 is also provided with GND pads 13 which are not covered by the cover layers 80 and 90 to be described later and exposed, on the front and the rear of the flexible printed circuit board 10, in a similar manner to the aforementioned signal pad 11. The GND pads 13 are also subjected to electrical interlayer connection with respect to two ground layers 60 and 70 on the front side and the rear side via conductive through holes 14. Note that each of the conductive through holes 14 has a through hole 14a passing through the flexible printed circuit board 10, and a conductive coating film 14b of plating or the like formed on an inner wall side of the through hole 14a, in a similar manner to the aforementioned conductive through hole 12, and the GND pads 13 and the ground layers 60 and 70 are electrically connected via the conductive coating films 14b.

Note that as a diameter of each of the conductive through holes 12 and 14, there can be cited 25 μm, for example.

As illustrated in FIG. 3, the signal line 20 is laminated on an insulating layer 30. Further, on an upper surface side of the signal line 20 and the insulating layer 30, an insulating layer 40 is laminated via an adhesive material layer 50. In the present embodiment, each of the insulating layers 30 and 40 uses a thermoplastic resin such as, for example, LCP (Liquid Crystal Polymer: LCP) as its material. Further, the adhesive material layer 50 corresponds to a part having not only an adhesiveness but also an electrical insulation property. Note that as a thickness of each of the insulating layers 30 and 40, there can be cited 25 μm, for example. Further, as a thickness of the adhesive material layer 50, there can be cited 15 μm, for example.

Further, as illustrated in FIG. 3, the ground layer 60 is provided on the upper surface side of the insulating layer 30. Further, the ground layer 70 is provided on a lower surface side of the insulating layer 40. Each of the ground layers 60 and 70 corresponds to a conductive part which uses, for example, a copper foil as its material. Such ground layers 60 and 70 exist on both surfaces above and below the signal line 20, and further, the signal line 20 is covered by insulators such as the insulating layers 30 and 40, thereby configuring a strip transmission path propagating an electromagnetic wave.

Note that as a thickness of each of the signal line 20, and the ground layers 60 and 70, there can be cited 12 μm, for example.

The ground layers 60 and 70 have solid ground layers 61 and 71, and mesh ground layers 62 and 72. As illustrated in FIG. 3, the solid ground layers 61 and 71 correspond to parts having a uniform thickness in a width direction (Y direction) in the ground layers 60 and 70. On the other hand, the mesh ground layers 62 and 72 are different from the solid ground layers 61 and 71, and correspond to parts in which conductive portions 62a and 72a made of a copper foil or the like are formed in a mesh shape (net-like shape). Specifically, as illustrated in FIG. 1, FIG. 4, and FIG. 5, the mesh ground layers 62 and 72 are provided in a manner that the conductive portions 62a and 72a surround a periphery of openings 62b and 72b in which the conductive portions 62a and 72a do not exist (the conductive portions 62a and 72a are removed). Accordingly, the mesh ground layers 62 and 72 are provided in the mesh shape (net-like shape).

A large number of the aforementioned openings 62b and 72b are provided, and further, the openings 62b and 72b having the same shape are arranged in a predetermined direction and in a direction orthogonal to the predetermined direction. Therefore, the conductive portions 62a and 72a provided so as to surround the openings 62b and 72b also form a regular pattern.

In the present embodiment, each of the openings 62b and 72b is provided to be a square or a rhombus. Therefore, one unit (one element) of each of the mesh ground layers 62 and 72 also has a square shape or a rhombic shape. However, each of the openings 62b and 72b may also have a shape other than the square shape or the rhombic shape. For example, the shape may also be a rectangular shape, a circular shape, or other than that, it may also be a polygonal shape including a triangular shape, an oblong shape, or an elliptic shape, and it is possible to adopt regular or irregular various shapes other than the above.

Note that the arrangement of the mesh ground layers 62 and 72 in the flexible printed circuit board 10 will be described later. Further, in the mesh ground layers 62 and 72, each of the openings 62b and 72b has a dimension of opening smaller than a wavelength of the electromagnetic wave assumed to be transmitted by the signal line 20.

On the ground layers 60 and 70 having the solid ground layers 61 and 71 and the mesh ground layers 62 and 72 as described above, the cover layers 80 and 90 are respectively disposed so as to cover the ground layers (refer to FIG. 3 to FIG. 5). Specifically, on an upper surface side of the ground layer 60, the cover layer 80 is provided, and the cover layer 80 covers the ground layer 60. Further, on a lower surface side of the ground layer 70, the cover layer 90 is provided, and the cover layer 90 covers the ground layer 70.

The cover layers 80 and 90 have insulating resin layers 81 and 91 each using a thermoplastic resin such as, for example, LCP (Liquid Crystal Polymer: LCP) as its material, and adhesive material layers 82 and 92 each having the adhesiveness and the electrical insulation property. Note that as a thickness of each of the insulating resin layers 81 and 91, there can be cited 25 μm, for example, with respect to the ground layers 60 and 70 each having a thickness of 12 μm, for example, and as a thickness of each of the adhesive material layers 82 and 92, there can be cited 15 μm, for example. In this case, there is created a state where the lamination can be performed with no problem regarding delamination and the like.

Regarding Arrangement of Mesh Ground Layers 62 and 72

First Configuration Example

Next, the first configuration example in the arrangement of the mesh ground layers 62 and 72 in the flexible printed circuit board 10 will be described. As illustrated in FIG. 1, the mesh ground layers 62 and 72 are provided so as to exist on the front surface side and the rear surface side of the flexible printed circuit board 10 in an alternate manner. Specifically, in the vicinity of the line 4-4 in FIG. 1, the mesh ground layers 62 and 72 are arranged on the front surface side of the flexible printed circuit board 10, as illustrated in FIG. 4. Meanwhile, in the vicinity of the line 5-5 in FIG. 1, the mesh ground layers 62 and 72 are arranged on the rear surface side of the flexible printed circuit board 10, as illustrated in FIG. 5.

The arrangement as described above will be explained based on FIG. 6. FIG. 6 is a side view illustrating a shape of the flexible printed circuit board 10 after the molding. As illustrated in FIG. 6, the flexible printed circuit board 10 after the molding has a pleated part PL formed in a pleated shape (bellows shape). The pleated part PL is provided with straight portions PL1 and curved portions PL2. Further, when the curved portions PL2 are deformed, the flexible printed circuit board 10 after the molding can be folded to have a short length or extended to have a long length, with the use of the pleated part PL. Specifically, the flexible printed circuit board 10 after the molding is provided so that an entire length thereof can be extended/contracted by the presence of the pleated part PL. Further, the flexible printed circuit board 10 after the molding can also be easily deformed in a manner that it is bent in respective directions, by the presence of the pleated part PL.

Here, each of the mesh ground layers 62 and 72 is positioned on an outer peripheral side of a curve made by the curved portion PL2, in the curved portion PL2 of the pleated part PL. Besides, when viewed along a side surface of the flexible printed circuit board 10 after the molding illustrated in FIG. 6, directions of curves made by the curved portions PL2 are set to be alternately switched. In FIG. 6, when viewed along the flexible printed circuit board 10, the directions of the curves made by the curved portions PL2 are set to be alternately switched. For this reason, the mesh ground layers 62 and 72 are provided so as to exist on the front surface side and the rear surface side of the flexible printed circuit board 10, in an alternate manner, as illustrated in FIG. 1.

Note that in FIG. 6, a part along the line 3-3 corresponds to FIG. 3, a part along the line 4-4 corresponds to FIG. 4, and a part along the line 5-5 corresponds to FIG. 5.

Here, if each of the mesh ground layers 62 and 72 exists on an inner peripheral side of the curve made by the curved portion PL2, an electrical interference sometimes occurs in any way at portions, in the pleated part PL, at which the signal lines 20 face each other. This is because portions having a positional relationship in which the openings 62b and 72b of the mesh ground layers 62 and 72 face each other exist.

However, when the mesh ground layers 62 and 72 exist on the outer peripheral side of the curved portions PL2, and the solid ground layers 61 and 71 exist on the inner peripheral side of the curved portions PL2 as in the present embodiment, there are no portions having a positional relationship in which the openings 62b and 72b of the mesh ground layers 62 and 72 face each other. Accordingly, it is possible to prevent the electrical interference of mutual signal lines 20, and further, it is also possible to prevent the fluctuation of characteristic impedance in the flexible printed circuit board 10.

Besides, when the mesh ground layers 62 and 72 exist on the outer peripheral side of the curves made by the curved portions PL2 as in the present embodiment, it is possible to reduce the bending stress when molding the flexible printed circuit board 10 into the pleated shape (bellows shape). In addition to that, since the bending stress is reduced, a structure in which a durability when the flexible printed circuit board 10 is repeatedly extended/contracted is also secured, is realized. Furthermore, since the strip transmission path propagating the electromagnetic wave is configured in the flexible printed circuit board 10, the function of blocking the noise from the outside is also not impaired.

Note that in the flexible printed circuit board 10 configured as above, a line width of the signal line 20 (dimension A in FIG. 7) whose characteristic impedance becomes 50Ω is 35 μm in a cross section along the line 2-2 illustrated in FIG. 2 and a cross section along the line 3-3 illustrated in FIG. 3. Further, although depending on an opening proportion (proportion of removing the copper foil) of the mesh ground layers 62 and 72, when the opening proportion is set to 75%, the line width of the signal line 20 (dimension B in FIG. 7) whose characteristic impedance becomes 50Ω, is 50 μm in a cross section along the line 4-4 illustrated in FIG. 4 and a cross section along the line 5-5 illustrated in FIG. 5.

Further, as an example of dimensions of each of the mesh ground layers 62 and 72 whose opening proportion becomes 75% as described above, there can be cited one in which a line width of the conductive portion 62a is 120 μm, and each of a lengthwise dimension and a crosswise dimension of the opening is 800 μm.

Figure 7:
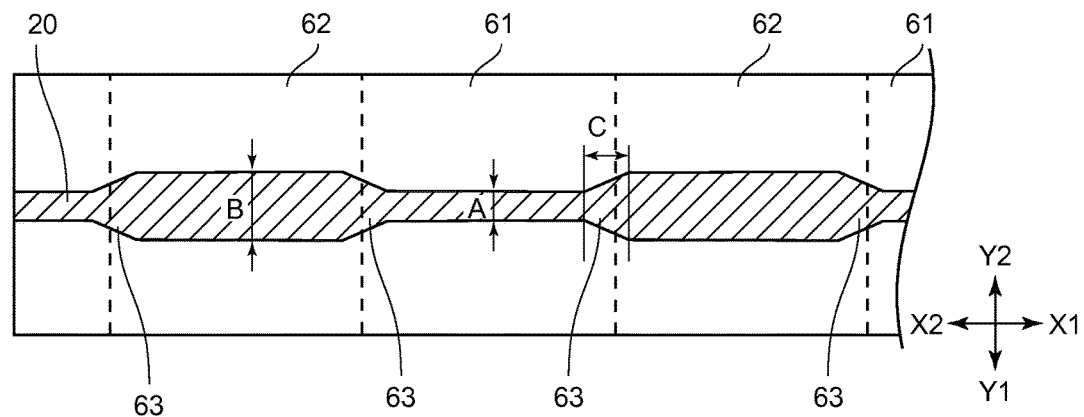
FIG. 7 is a plan view illustrating an image of a change in a width of a signal line.

FIG. 7 is a plan view illustrating an image of a change in the width of the signal line 20. As in FIG. 7 and the example of dimensions described above, the portions in which the mesh ground layers 62 and 72 exist and the portions in which the layers do not exist have a different line width of the signal line 20. For this reason, there are provided bridge portions 63 and 73 whose line width is continuously changed, to prevent a discontinuous state of the portions with different line width of the signal line 20. The bridge portions 63 and 73 are provided in a manner that a length thereof (dimension C in FIG. 7) is about 0.5 mm, for example, and the line width thereof is continuously changed from the portions in which the mesh ground layers 62 and 72 exist toward the portions in which the layers do not exist. Note that in the configuration illustrated in FIG. 7, the line width is proportionately changed toward the X direction, but, it may also be changed in a manner other than the proportional manner.

Note that it is also possible to unify the line width of the signal line 20 by an intermediate line width between the line width at the portions in which the mesh ground layers 62 and 72 exist and the line width at the portions in which the layers do not exist. As an example of dimension as above, there can be cited 40 μm, for example. It is confirmed that even the signal line with the intermediate line width in the example of dimension as above has a transmission characteristic similar to that of the signal line having the bridge portions 63 and 73 as described above, up to a frequency band of about 5 GHz.

Note that in the flexible printed circuit board 10 in the first configuration example as above, the mesh ground layers 62 and 72 are arranged on the outer peripheral side of the curved portions PL2, so that deformation easily occurs on the outer peripheral side of the curved portions PL2. On the other hand, the solid ground layers 61 and 71 are arranged on the inner peripheral side of the curved portions PL2. Therefore, the mesh ground layers 62 and 72 are easily deformed so as to be compressed, which makes it possible to make the signal line 20 generate a compressive stress.

Regarding Arrangement of Mesh Ground Layers 62 and 72

Second Configuration Example

Figure 8:
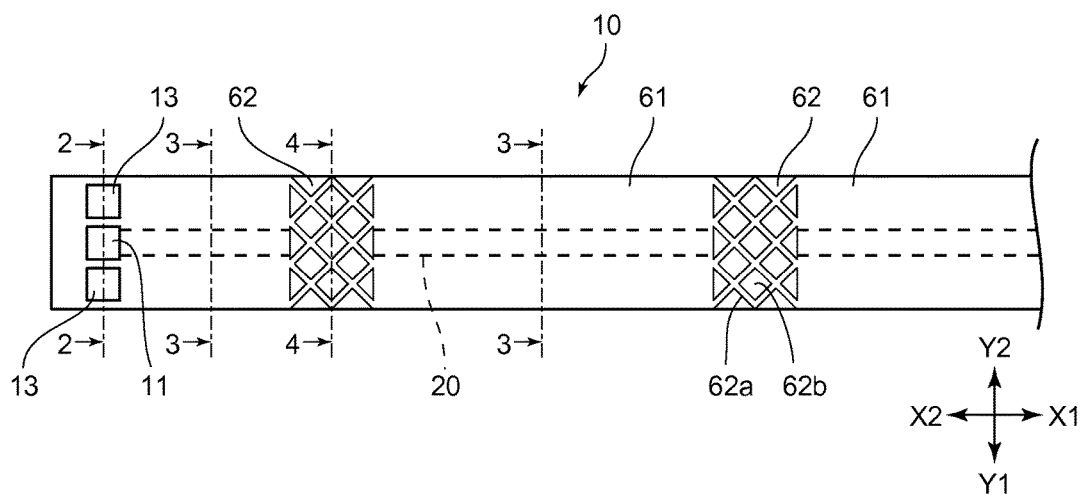
FIG. 8 is a plan view illustrating a second configuration example of the flexible printed circuit board before the molding, which corresponds to a modified example of FIG. 1.

Next, a second configuration example in the arrangement of the mesh ground layers 62 (mesh ground layers 72) in the flexible printed circuit board 10 will be described. FIG. 8 is a plan view illustrating the second configuration example of the flexible printed circuit board 10 before molding, which corresponds to a modified example of FIG. 1. Note that in the following explanation regarding the flexible printed circuit board 10 in the second configuration example, explanation of a part common to that of the flexible printed circuit board 10 in the first configuration example will be omitted.

As illustrated in FIG. 8, configurations of most of the parts of the flexible printed circuit board 10 in the second configuration example are common to those of the flexible printed circuit board 10 in the first configuration example as illustrated in FIG. 1. However, the arrangement of the mesh ground layers 62 (mesh ground layers 72) in the flexible printed circuit board 10 in the second configuration example is different from that of the flexible printed circuit board 10 in the first configuration example.

Figure 9:
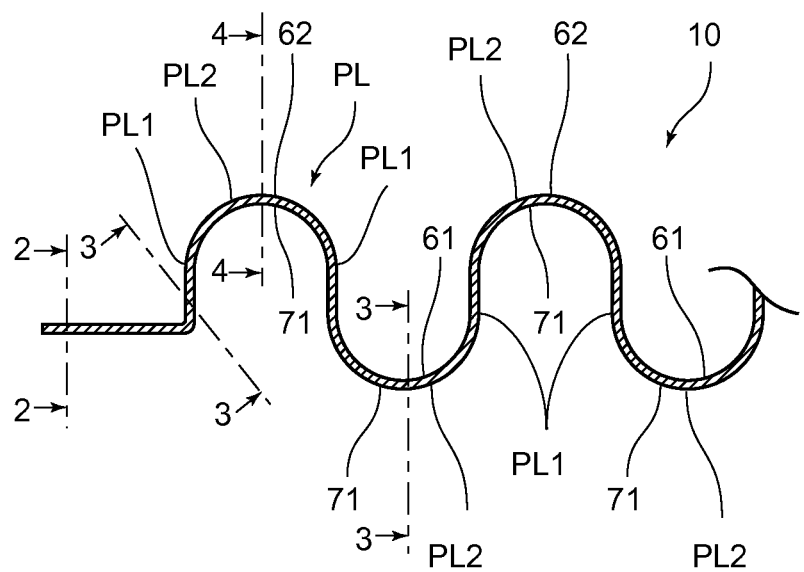
FIG. 9 is a side view illustrating a shape of the flexible printed circuit board after the molding in the second configuration example.

FIG. 9 is a side view illustrating a shape of the flexible printed circuit board 10 after the molding in the second configuration example. As illustrated in FIG. 8 and FIG. 9, in the second configuration example, the mesh ground layer 62 or 72 is disposed on the outer peripheral side of the curved portion PL2 bent in the right direction or on the outer peripheral side of the curved portion PL2 bent in the left direction, in the pleated part PL of the flexible printed circuit board 10 after the molding. Accordingly, the mesh ground layer 62 (mesh ground layer 72) is arranged on the outer peripheral side of the curved portion PL2 in a state where it is arranged on a certain curved portion PL2, but is not arranged on the adjacent curved portion PL2, namely, it is arranged at every other curved portion (alternately arranged).

Figure 10:
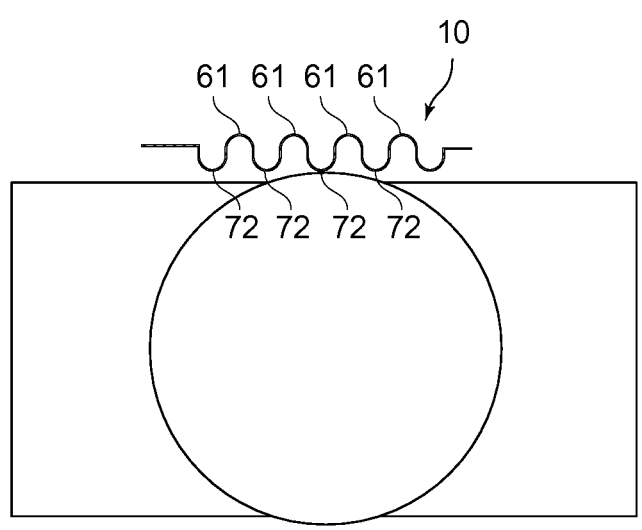
FIG. 10 is a view illustrating an image in which the flexible printed circuit board related to the second configuration example is applied to a pivot part of an external device such as a joint or the like of arms of a robot or the like, and a view illustrating a state where two arms keep a horizontal state.
Figure 11:
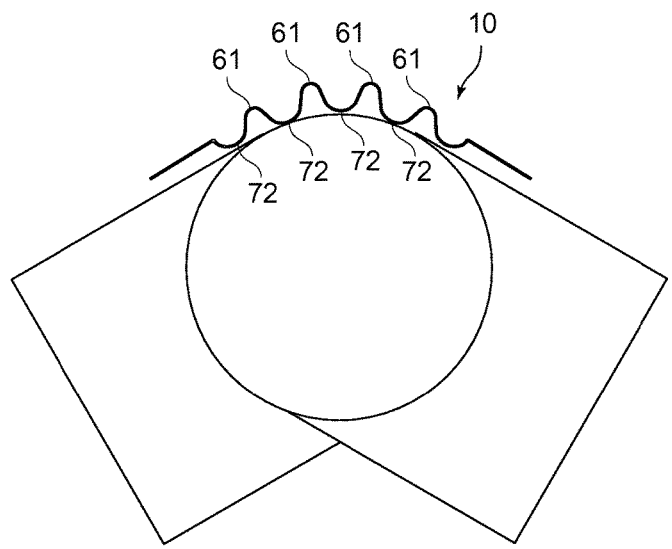
FIG. 11 is a view illustrating a state where the two arms in FIG. 10 pivot.

Note that although FIG. 9 to FIG. 11 illustrate the configuration in which only the mesh ground layers 72 exist, and the mesh ground layers 62 do not exist, it is also possible to adopt a configuration in which only the mesh ground layers 62 exist, and the mesh ground layers 72 do not exist, as a matter of course.

For this reason, the configuration of the flexible printed circuit board 10 in the second configuration example is largely different from the configuration such as one in the first configuration example in which the mesh ground layers 62 and 72 exist on the front surface side and the rear surface side of the flexible printed circuit board 10 in the alternate manner. Specifically, the flexible printed circuit board 10 in the second configuration example employs either a configuration in which the mesh ground layers 62 exist only on the front surface side (upper surface side) of the flexible printed circuit board 10, or a configuration in which the mesh ground layers 72 exist only on the rear surface side (lower surface side) of the flexible printed circuit board 10.

As is apparent from FIG. 9, also in the flexible printed circuit board 10 in the second configuration example as above, the mesh ground layers 72 (or the mesh ground layers 62 in the configuration other than that of FIG. 9 and the like; which similarly applies to the following description) exist on the outer peripheral side of the curves made by the curved portions PL2. Accordingly, there are no portions having a positional relationship in which the openings 72b (openings 62b) of the mesh ground layers 72 (mesh ground layers 62) face each other. Consequently, it is possible to prevent the electrical interference of mutual signal lines 20, and further, it is also possible to prevent the fluctuation of characteristic impedance in the flexible printed circuit board 10.

FIG. 10 is a view illustrating an image in which the flexible printed circuit board 10 related to the second configuration example is applied to a pivot part of an external device such as a joint or the like of arms of a robot or the like, and a view illustrating a state where two arms keep a horizontal state. Further, FIG. 11 is a view illustrating a state where the two arms in FIG. 10 pivot. Note that in the application example illustrated in FIG. 10 and FIG. 11, the mesh ground layers 72 are positioned at the curved portions PL2 on an inside diameter side of the pivot part. Specifically, it is configured such that the mesh ground layers 62 positioned at the curved portions PL2 on an outside diameter side of the pivot part do not exist.

As illustrated in FIG. 10, when the flexible printed circuit board 10 in the second configuration example is arranged along the pivot part, the curved portions PL2 positioned on the inside diameter side (inside) are deformed so as to be widely opened. Accordingly, by arranging the mesh ground layers 72 on the outer peripheral side of the curved portions PL2 on the inside diameter side (inside) (namely, the side positioned closest to the inside diameter side), the curved portions PL2 positioned on the inside diameter side (inside) are easily deformed so as to be widely opened.

At this time, in the curved portions PL2 on the inside diameter side, although the mesh ground layers 72 on the outer peripheral side are largely deformed due to an action of compressive stress, the solid ground layers 61 on the inner peripheral side are difficult to be deformed, when compared to the mesh ground layers 72 on the outer peripheral side, although a tensile stress acts on the solid ground layers 61 on the inner peripheral side. For this reason, a neutral axis of stress moves to the outer peripheral side, and thus is separated from the inner peripheral side. Consequently, not the tensile stress, but the compressive stress acts on the signal line 20.

Note that the curved portions PL2 positioned on the outside diameter side (outside) are deformed so as to be closed, as illustrated in FIG. 11. However, in each of the curved portions PL2 positioned on the outside diameter side (outside), the solid ground layer 61 is arranged on both of the inner peripheral side and the outer peripheral side thereof. Accordingly, in the curved portion PL2 positioned on the outside diameter side (outside), the deformation in the closing direction becomes smaller than the deformation so as to be opened in the mesh ground layer 72. Specifically, due to the difference between the presence and the absence of the mesh ground layer 72, the curved portion PL2 positioned on the inside diameter side (inside) is selectively deformed so as to be widely opened, but, only small deformation occurs on the curved portion PL2 positioned on the outside diameter side (outside), as illustrated in FIG. 11.

According to the configuration as above, by using the flexible printed circuit board 10 in the second configuration example at the pivot part of the external device such as the joint or the like of the arms of the robot or the like, it is possible to reduce the stress which acts on the signal line 20 during a motion, and further, a structure capable of withstanding repetitive motions is realized.

Regarding Manufacturing Method of Flexible Printed Circuit Board 10

Subsequently, a manufacturing method of the flexible printed circuit board 10 in the first configuration example and the second configuration example will be described hereinafter. Note that in the following description, a first step to a seventh step will be sequentially described, but, it is also possible that the manufacturing method of the flexible printed circuit board 10 in the respective embodiments includes various steps other than the above steps, as a matter of course.

(1) First Step: Formation of Signal Line 20

Figure 12:
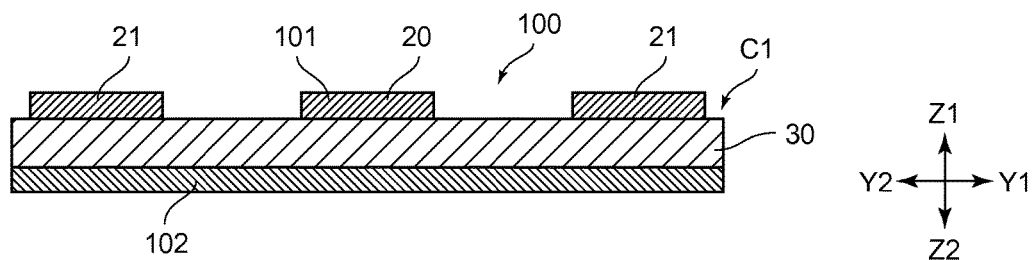
FIG. 12 is a view related to a first step, and illustrating a state where a signal line and receiving lands are formed in the 2-2 cross section in FIG. 1 and FIG. 8.
Figure 13:
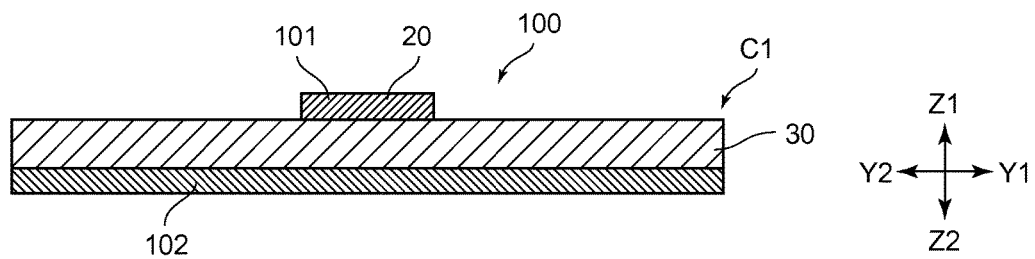
FIG. 13 is a view related to the first step, and illustrating a state where the signal line is formed in the 3-3 cross section, the 4-4 cross section, and the 5-5 cross section in FIG. 1 and FIG. 8.

FIG. 12 is a view related to a first step, and illustrating a state where the signal line 20 and receiving lands 21 are formed in the 2-2 cross section in FIG. 1 and FIG. 8. FIG. 13 is a view related to the first step, and illustrating a state where the signal line 20 is formed in the 3-3 cross section, the 4-4 cross section, and the 5-5 cross section in FIG. 1 and FIG. 8. As illustrated in FIG. 12 and FIG. 13, a double-sided copper-clad laminate 100 having base copper foil layers 101 and 102 on both surfaces of the insulating layer 30 is prepared. Further, the signal line 20 to be positioned later on the inner layer side, and the receiving lands 21 of the conductive through holes 12 and 14 are formed by using a normal photofabrication method such as etching. Consequently, an intermediate product C1 as illustrated in FIG. 12 and FIG. 13 is formed.

(2) Second Step: Lamination of Single-Sided Copper-Clad Laminate 200

Figure 14:
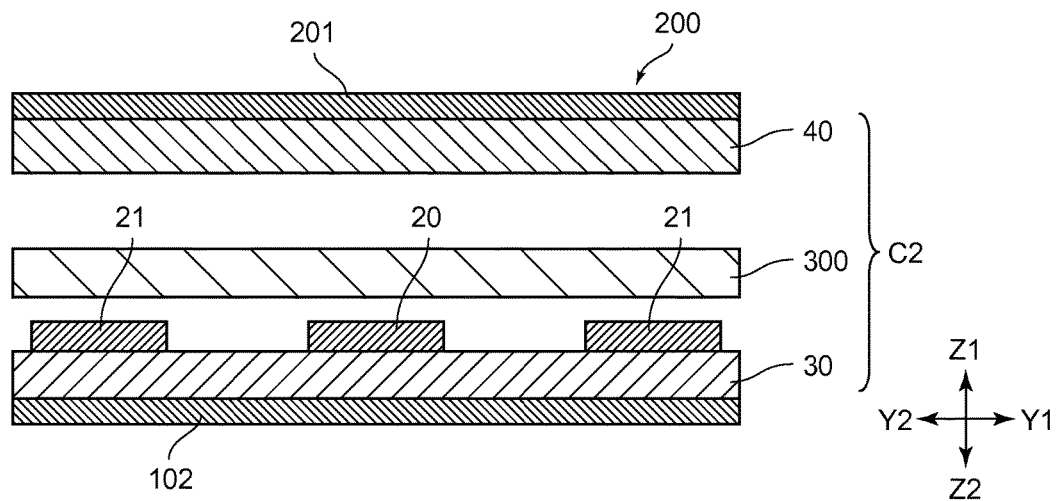
FIG. 14 is a view related to a second step, and illustrating a state of laminating a single-sided copper-clad laminate on a double-sided copper-clad laminate in the 2-2 cross section in FIG. 1 and FIG. 8.
Figure 15:
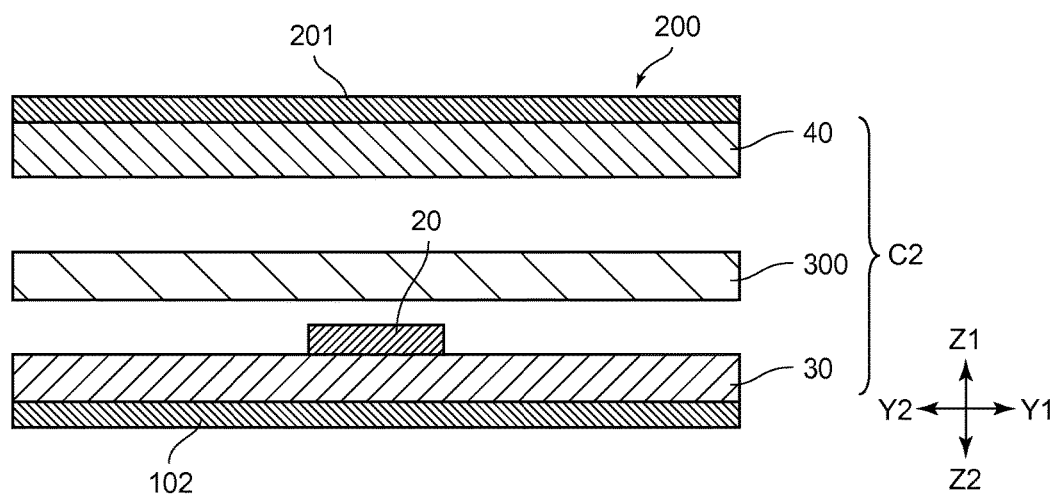
FIG. 15 is a view related to the second step, and illustrating a state of laminating the single-sided copper-clad laminate on the double-sided copper-clad laminate in the 3-3 cross section, the 4-4 cross section, and the 5-5 cross section in FIG. 1 and FIG. 8.

FIG. 14 is a view related to a second step, and illustrating a state of laminating a single-sided copper-clad laminate 200 on the double-sided copper-clad laminate 100 in the 2-2 cross section in FIG. 1 and FIG. 8. FIG. 15 is a view related to the second step, and illustrating a state of laminating the single-sided copper-clad laminate 200 on the double-sided copper-clad laminate 100 in the 3-3 cross section, the 4-4 cross section, and the 5-5 cross section in FIG. 1 and FIG. 8.

As illustrated in FIG. 14 and FIG. 15, the single-sided copper-clad laminate 200 and a lamination adhesive material 300 are prepared. Further, the lamination adhesive material 300 is stuck so as to cover the upper surface side of the insulating layer 30, and after that, the single-sided copper-clad laminate 200 is stuck to the upper surface side of the lamination adhesive material 300. The single-sided copper-clad laminate 200 includes the insulating layer 40, and a base copper foil layer 201 is provided on a surface of one side (upper surface) of the insulating layer 40. Note that a product after the sticking is set to an intermediate product C2.

The lamination adhesive material 300 corresponds to a part to be the adhesive material layer 50 after the sticking. As such a lamination adhesive material 300, one with low elasticity is preferable, in order not to hinder molding to be performed later. Concretely, since an elastic modulus of LCP film is about 3 to 4 GPa, by using the lamination adhesive material 300 whose elastic modulus is 2 GPa or less, which is half or less of the elastic modulus of the LCP film, it is possible to realize the lamination without exerting an influence on moldability. Further, when the molding is conducted, heating is performed at about 200° C. for about 30 minutes. Accordingly, as the lamination adhesive material 300, one whose adhesiveness and electric insulation property are not significantly deteriorated by such a thermal history, is suitable.

(3) Third Step: Formation of Through Holes 12a and 14a

Figure 16:
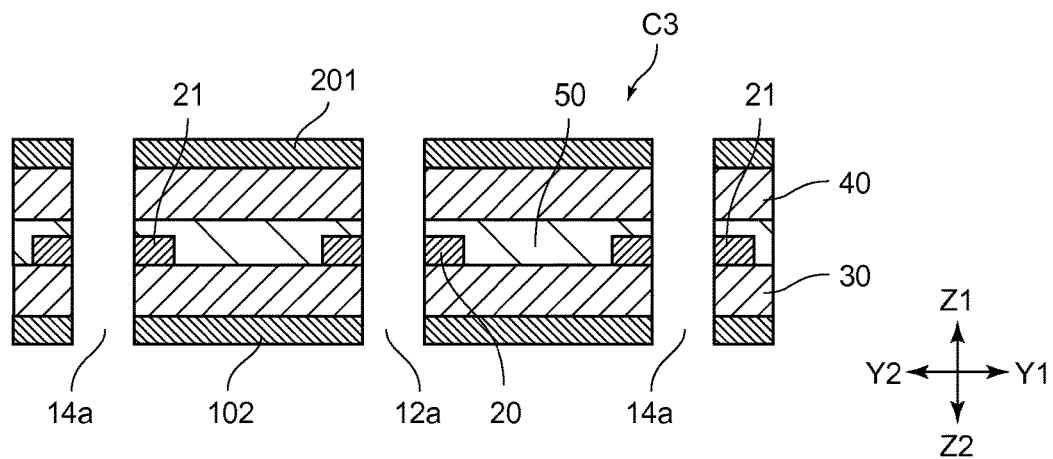
FIG. 16 is a view related to a third step, and illustrating a state where conductive through holes are formed in the 2-2 cross section in FIG. 1 and FIG. 8.
Figure 17:
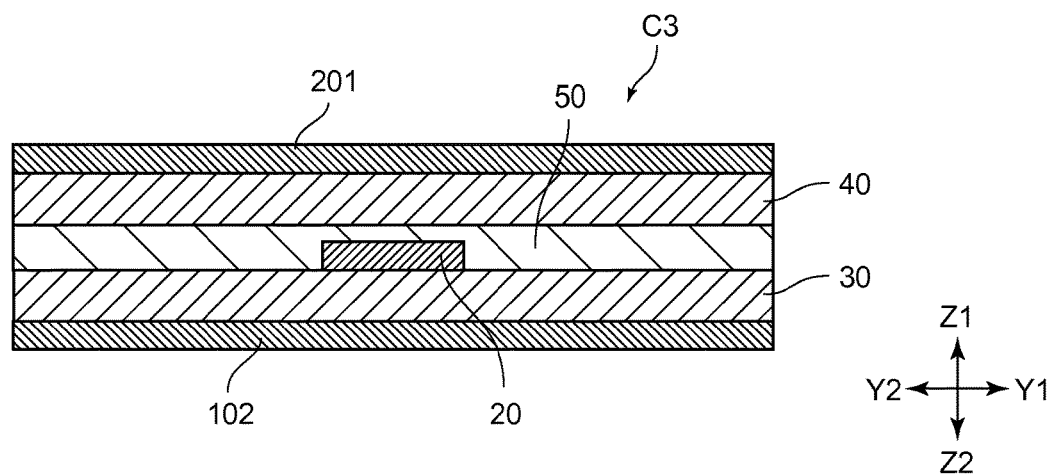
FIG. 17 is a sectional side view related to the third step, and illustrating a configuration in the 3-3 cross section, the 4-4 cross section, and the 5-5 cross section in FIG. 1 and FIG. 8.

FIG. 16 is a view related to a third step, and illustrating a state where the through holes 12a and 14a are formed in the 2-2 cross section in FIG. 1 and FIG. 8. FIG. 17 is a sectional side view related to the third step, and illustrating a configuration in the 3-3 cross section, the 4-4 cross section, and the 5-5 cross section in FIG. 1 and FIG. 8. As illustrated in FIG. 16, the through holes 12a and 14a for interlayer connection to be performed later with the signal pad 11 and the GND pads 13 are formed on the intermediate product C2. Such hole-opening processing may be performed through processing using an NC drill, and it is also possible to realize the interlayer connection using non-penetrating bottomed via holes formed by a laser or the like. Note that a product after performing such hole-opening processing is set to an intermediate product C3.

(4) Fourth Step: Formation of Conductive Coating Films 12b and 14b

Figure 18:
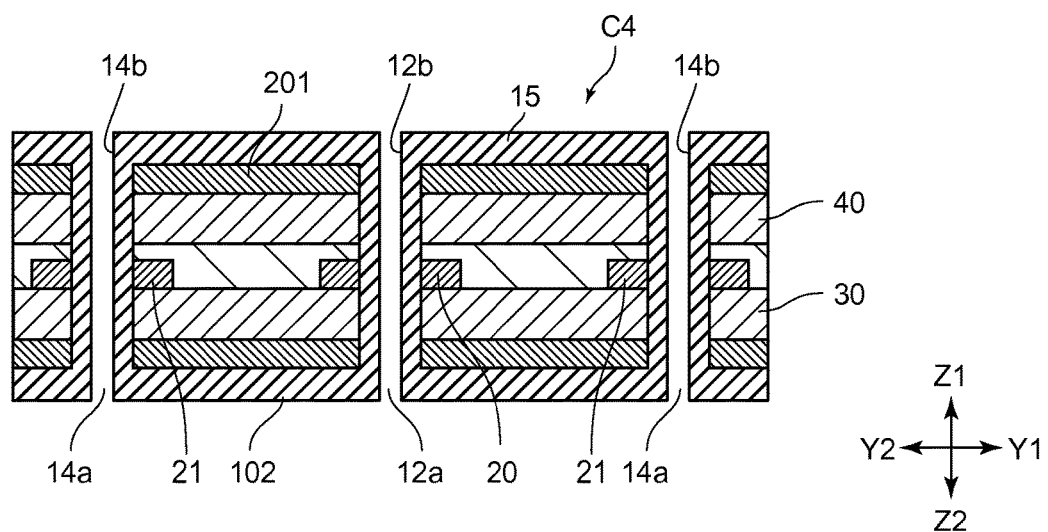
FIG. 18 is a view related to a fourth step, and illustrating a state where a conductive coating film layer for forming a conductive coating film on the through holes is formed in the 2-2 cross section in FIG. 1 and FIG. 8.

FIG. 18 is a view related to a fourth step, and illustrating a state where a conductive coating film layer 15 for forming conductive coating films 12b and 14b on the through holes 12a and 14a is formed in the 2-2 cross section in FIG. 1 and FIG. 8. As illustrated in FIG. 18, in the intermediate product C3 after performing the hole-opening processing, partial plating is applied to the part corresponding to the 2-2 cross section, to thereby form the conductive coating film layer 15 to be a base of the conductive coating films 12b and 14b. Consequently, an interlayer conduction in which three layers are electrically connected to one another is obtained. Note that a product after being subjected to the partial plating is set to an intermediate product C4.

(5) Fifth Step: Patterning of Base Copper Foil Layers 101 and 102

Figure 19:
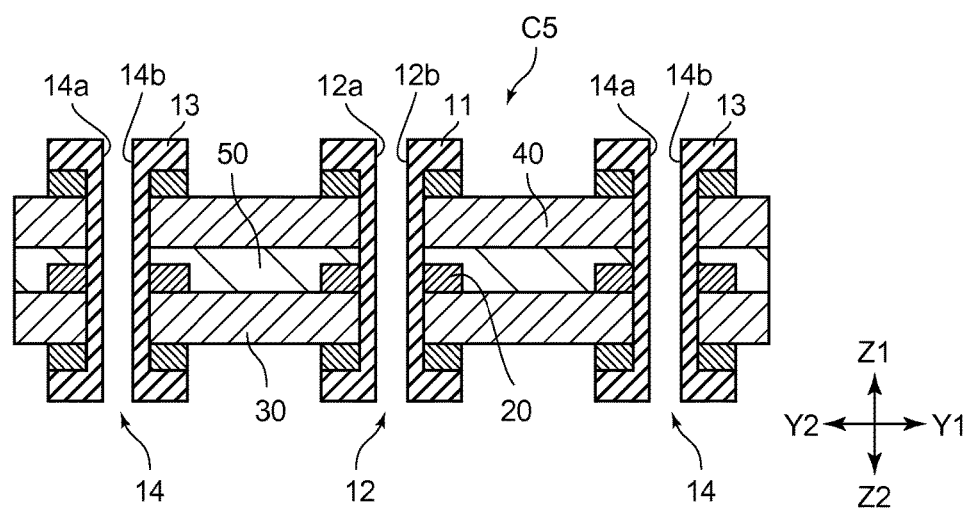
FIG. 19 is a view related to a fifth step, and illustrating a state where patterning is performed in the 2-2 cross section in FIG. 1 and FIG. 8.
Figure 20:
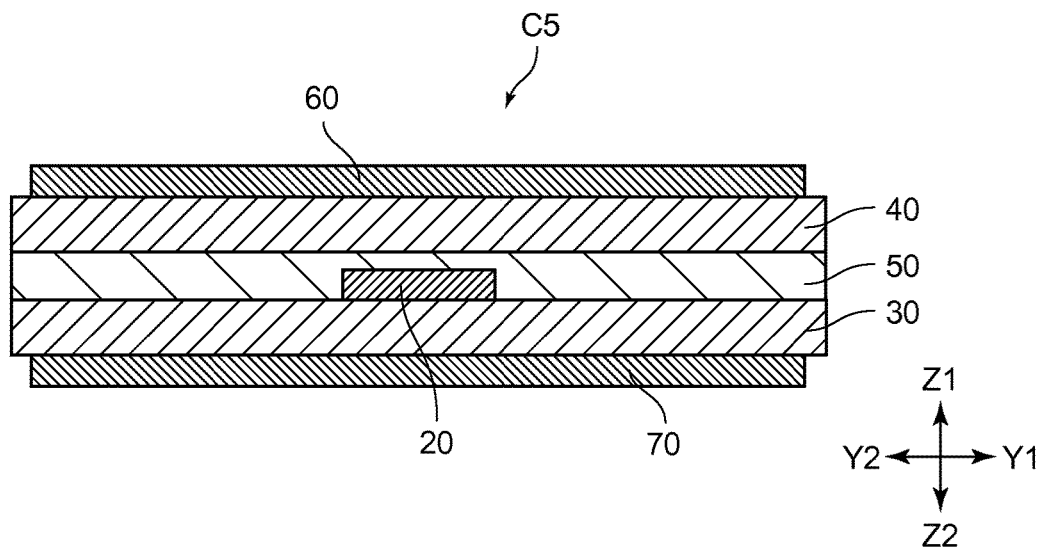
FIG. 20 is a view related to the fifth step, and illustrating a state where the patterning is performed in the 3-3 cross section in FIG. 1 and FIG. 8.
Figure 21:
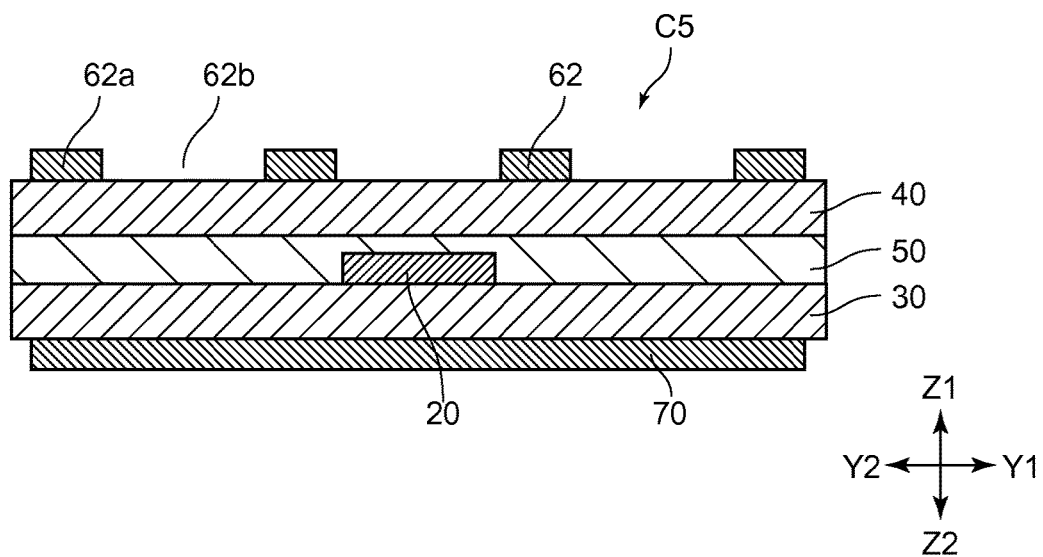
FIG. 21 is a view illustrating a state where the patterning is performed in the 4-4 cross section in FIG. 1 and FIG. 8.
Figure 22:
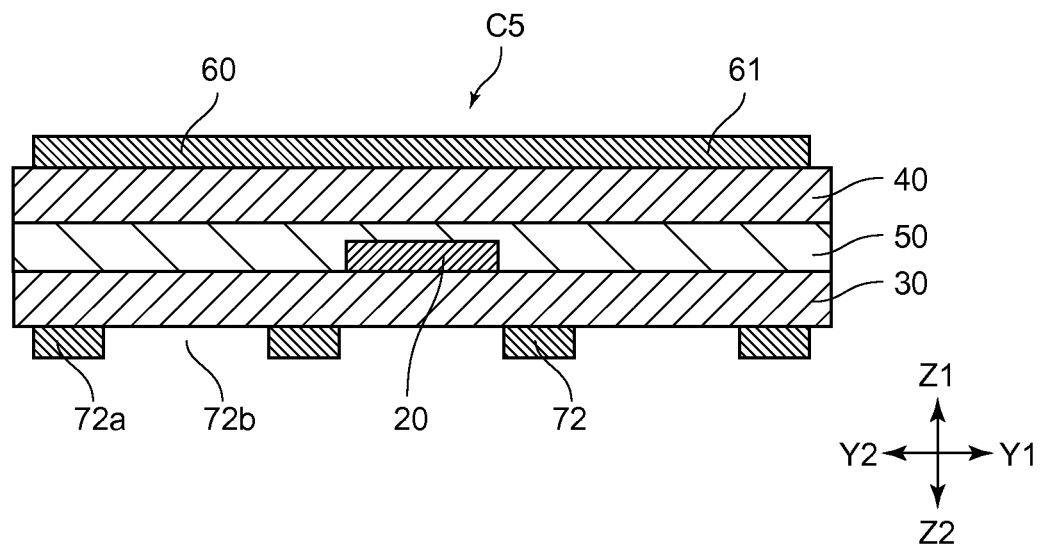
FIG. 22 is a view illustrating a state where the patterning is performed in the 5-5 cross section in FIG. 1 and FIG. 8.

FIG. 19 is a view related to a fifth step, and illustrating a state where patterning is performed in the 2-2 cross section in FIG. 1 and FIG. 8. FIG. 20 is a view related to the fifth step, and illustrating a state where the patterning is performed in the 3-3 cross section in FIG. 1 and FIG. 8. Further, FIG. 21 is a view illustrating a state where the patterning is performed in the 4-4 cross section in FIG. 1 and FIG. 8. FIG. 22 is a view illustrating a state where the patterning is performed in the 5-5 cross section in FIG. 1 and FIG. 8.

As illustrated in FIG. 19 to FIG. 22, the patterning is performed on the conductive coating film layer 15 and the base copper foil layers 101 and 102 by using the normal photofabrication method such as the etching, thereby forming necessary patterns. As illustrated in FIG. 19 to FIG. 22, resultants of the formation by such patterning are necessary patterns in the flexible printed circuit board 10 such as the signal pad 11, the GND pads 13, the solid ground layers 61 and 71, and the mesh ground layers 62 and 72. Note that a product obtained through the patterning is set to an intermediate product C5.

(6) Sixth Step: Formation of Cover Layers 80 and 90

Figure 23:
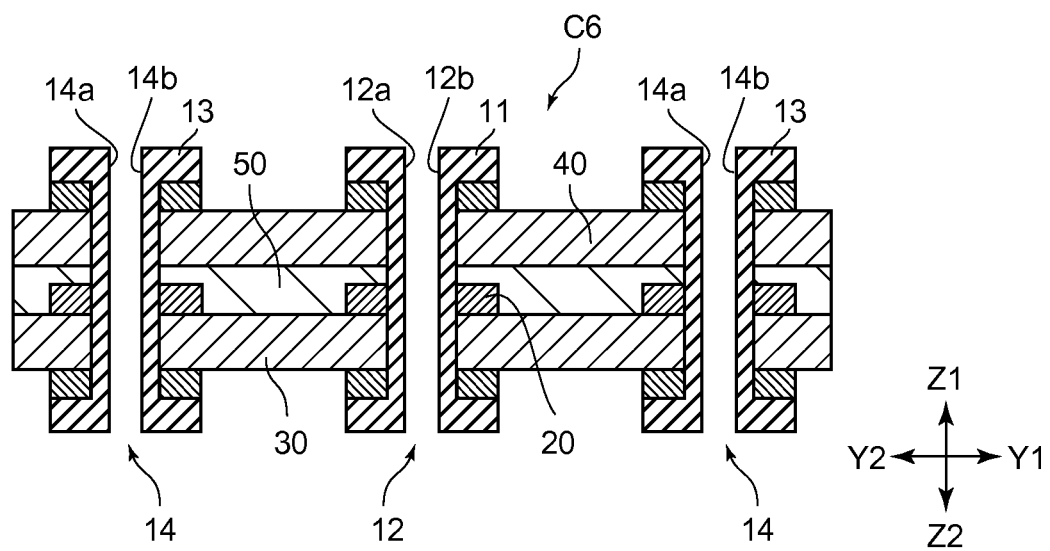
FIG. 23 is a view related to a sixth step, and illustrating a configuration in the 2-2 cross section in FIG. 1 and FIG. 8, when cover layers are formed.
Figure 24:
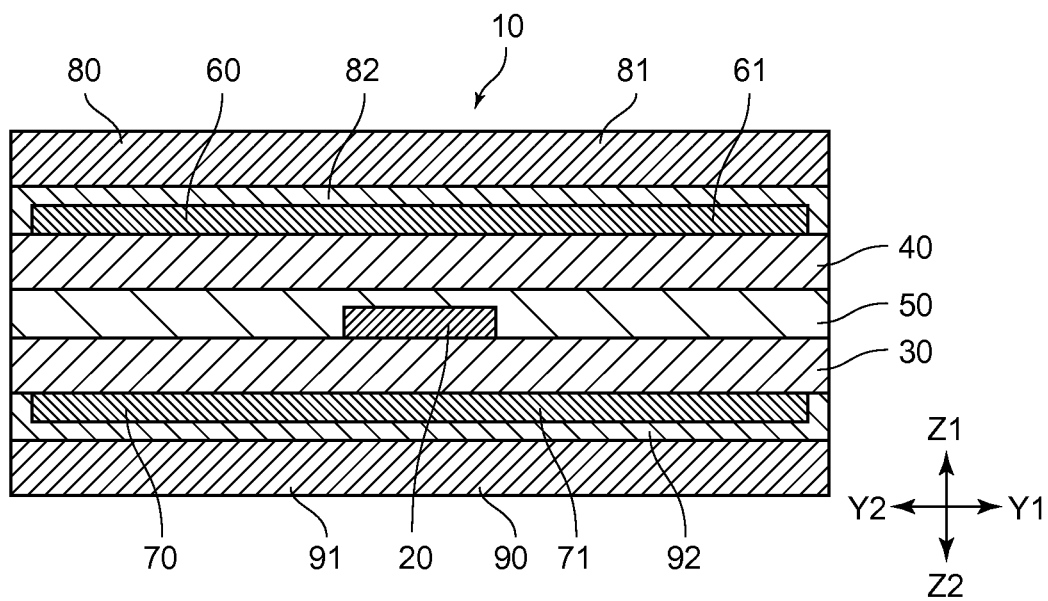
FIG. 24 is a view related to the sixth step, and illustrating a state where the cover layers are formed in the 3-3 cross section in FIG. 1 and FIG. 8.
Figure 25:
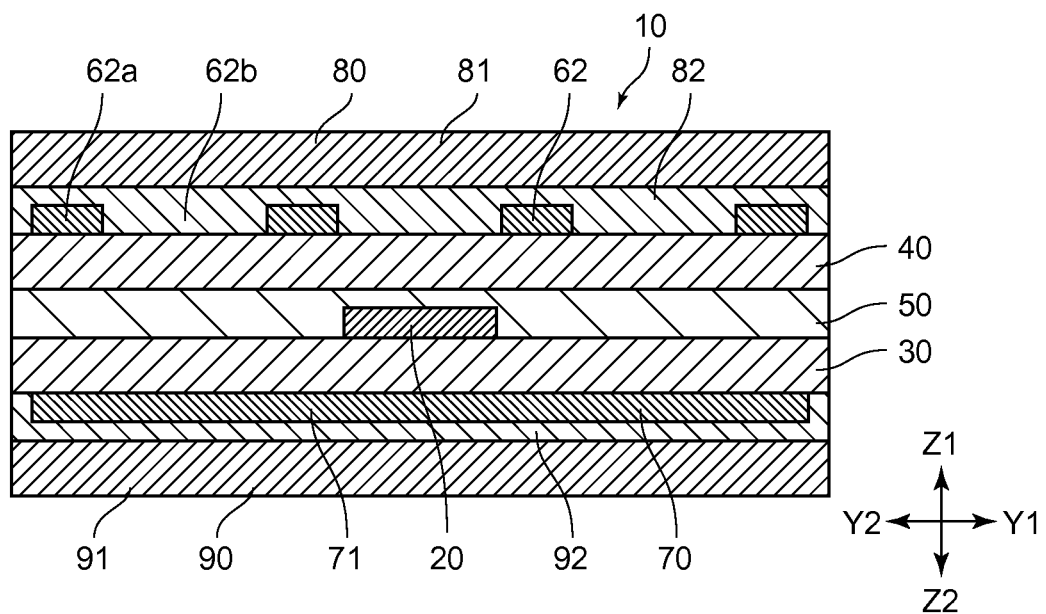
FIG. 25 is a view illustrating a state where the cover layers are formed in the 4-4 cross section in FIG. 1 and FIG. 8.
Figure 26:
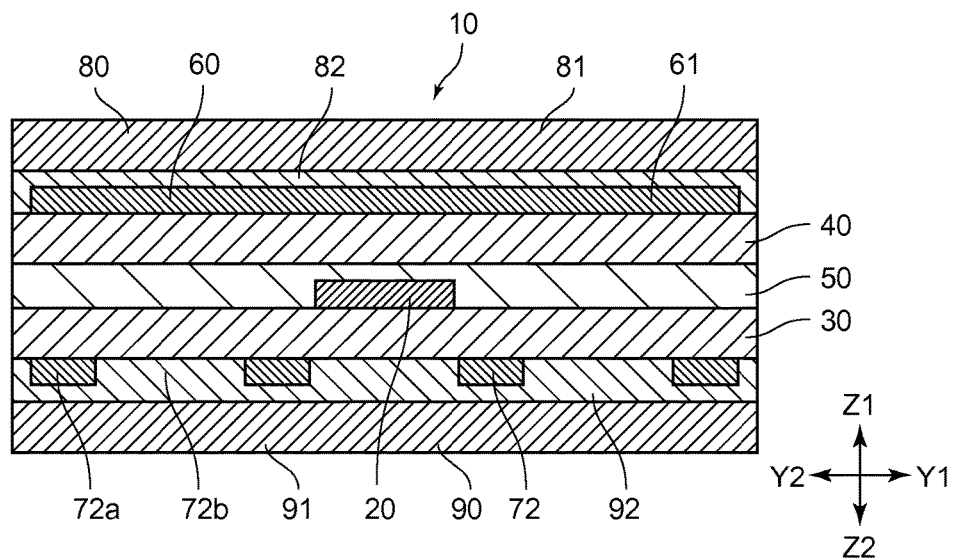
FIG. 26 is a view illustrating a state where the cover layers are formed in the 5-5 cross section in FIG. 1 and FIG. 8.

FIG. 23 is a view related to a sixth step, and illustrating a configuration in the 2-2 cross section in FIG. 1 and FIG. 8, when the cover layers 80 and 90 are formed. FIG. 24 is a view related to the sixth step, and illustrating a state where the cover layers 80 and 90 are formed in the 3-3 cross section in FIG. 1 and FIG. 8. Further, FIG. 25 is a view illustrating a state where the cover layers 80 and 90 are formed in the 4-4 cross section in FIG. 1 and FIG. 8. FIG. 26 is a view illustrating a state where the cover layers 80 and 90 are formed in the 5-5 cross section in FIG. 1 and FIG. 8.

As illustrated in FIG. 23 to FIG. 26, the cover layers 80 and 90 including the insulating resin layers 81 and 91, and the adhesive material layers 82 and 92 are formed on the intermediate product C5. Such formation of the cover layers 80 and 90 is performed by sticking the adhesive material layers 82 and 92 to the intermediate product C5. Note that there is a need to prevent the signal pad 11 and the GND pads 13 from being covered by the cover layers 80 and 90. For this reason, it is also possible to provide micro openings on portions, in the cover layers 80 and 90, corresponding to the signal pad 11 and the GND pads 13, through a method of photo-solder resist or the like. However, the solid ground layers 61 and 71 and the mesh ground layers 62 and 72, being parts other than the signal pad 11 and the GND pads 13, are in a state of being covered by the cover layers 80 and 90.

Note that it is also possible to perform, according to need, surface treatment such as electroless gold plating on the portions which are not covered by the cover layers 80 and 90. Through the steps as described above, the flexible printed circuit board 10 before the molding is obtained.

(7) Seventh Step: Heat-Molding of Flexible Printed Circuit Board 10

Figure 27:
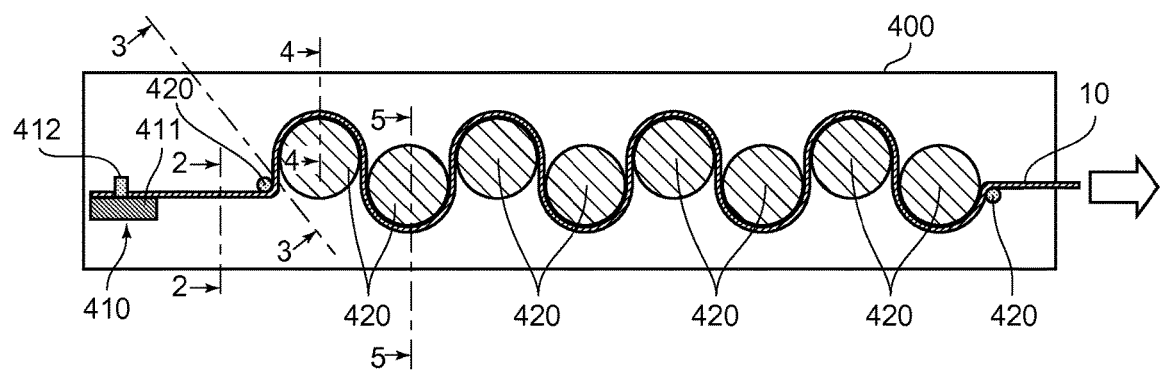
FIG. 27 is a view related to a seventh step, and illustrating a state where a flexible printed circuit board before molding is set in a jig.

FIG. 27 is a view related to a seventh step, and illustrating a state where the flexible printed circuit board 10 before the molding is set in a jig 400. As illustrated in FIG. 27, the flexible printed circuit board 10 before the molding is set in the jig 400 in an aligned state. Here, the jig 400 is provided with a tip fixing member 410. The tip fixing member 410 is provided with a tip receiving part 411 on which a tip side of the flexible printed circuit board 10 is mounted, and it is also provided with a hook pin 412 which is inserted into a not-illustrated hole portion on the tip side of the flexible printed circuit board 10.

The hole portion on the tip side of the flexible printed circuit board 10 is inserted into the hook pin 412 as above, and under that state, a setting of the flexible printed circuit board 10 in the jig 400 is completed while making the flexible printed circuit board 10 meander along jig pins 420 arranged at predetermined positions in the jig 400. After the setting, a constant tension is applied to a rear end side of the flexible printed circuit board 10. By performing heating, under that state, using an oven or the like, the flexible printed circuit board 10 with three-layer configuration including the LCP material having thermoplasticity is formed in a pleated shape (bellows shape), resulting in that the flexible printed circuit board 10 is in a state of having the pleated part PL as illustrated in FIG. 6 and FIG. 9.

Here, the heat-molding using the oven or the like is performed through heating at 200° C. for 30 minutes, for example. When the heat-molding is conducted in the above-described manner, the heat-molding is performed in a state where the position at which the flexible printed circuit board 10 is set, and the tension at the time of setting the board in the jig 400 are stabilized. For this reason, in the flexible printed circuit board 10 after the molding, a product shape is stabilized, and there is created a state where the mesh ground layers 62 and 72 are arranged, as intended, on the outer peripheral side of desired portions, in the curved portions PL2.

Note that when the entire length of the flexible printed circuit board 10 before the molding is about 400 mm, for example, the flexible printed circuit board 10 after the molding having the pleated part PL sometimes has its entire length of about 150 mm, as described above.

Further, after performing the molding, an unnecessary portion, in the flexible printed circuit board 10, such as the tip side positioned by the tip fixing member 410 and the like is cut according to need, thereby completing a final product. As a method of cutting the unnecessary portion as above, positioning of a start point side of the flexible printed circuit board 10 is performed by diverting the hole portion into which the hook pin 412 is inserted, and the opposite side of the start point side is positioned by abutment or the like. Further, it is possible to cut the portion by using a cutting jig such as a pinnacle die or a metal die. However, it is also possible to employ a method other than the above-described method for cutting the unnecessary portion. As such a method, there can be cited, for example, laser cutting using a laser, router cutting using a router bit, and the like.

Regarding Test Results

Table 1 represents results obtained by performing extension/contraction test regarding the flexible printed circuit board 10 having the pleated part PL formed in the above-described manner. In the extension/contraction test, the flexible printed circuit board 10 was repeatedly extended/contracted, and the presence/absence of disconnection of the signal line 20 during the test, an amount of extension of the flexible printed circuit board 10 between before and after the test, a fluctuation of direct current resistance of the flexible printed circuit board 10 between before and after the test, and a fluctuation of characteristic impedance between before and after the test, were evaluated.

Figure 28:
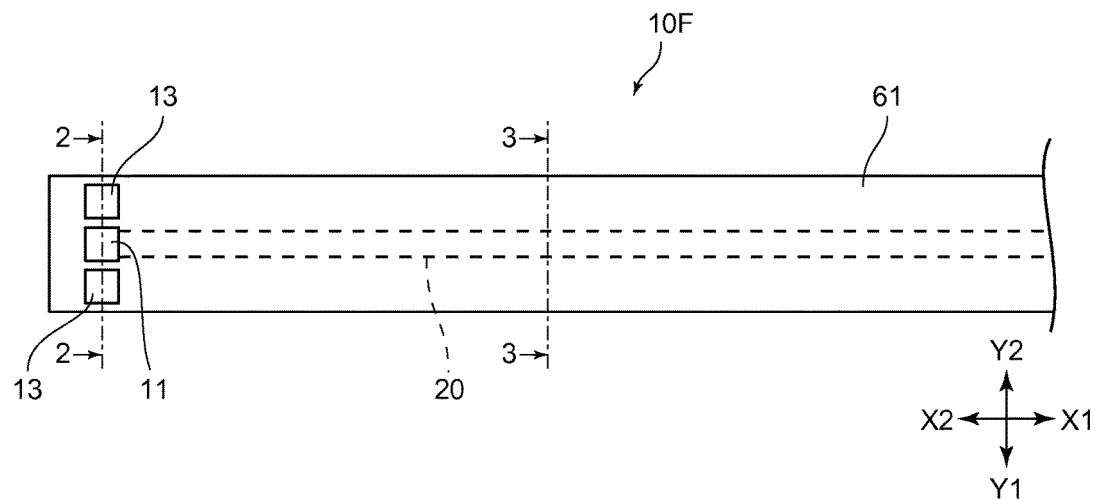
FIG. 28 is a plan view illustrating a configuration of a flexible printed circuit board having a conventional configuration.
Figure 29:
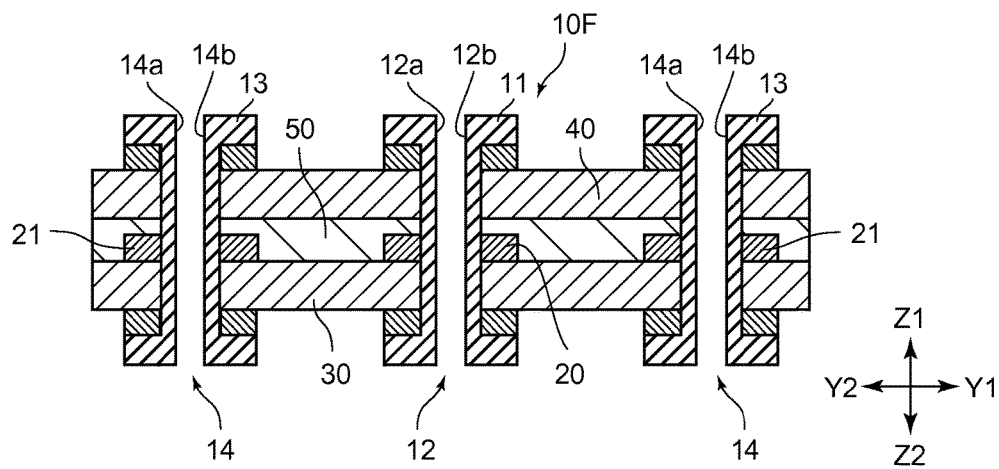
FIG. 29 is a sectional view of the flexible printed circuit board having the conventional configuration, and a view illustrating a state where the board is cut along the line 2-2 in FIG. 28.
Figure 30:
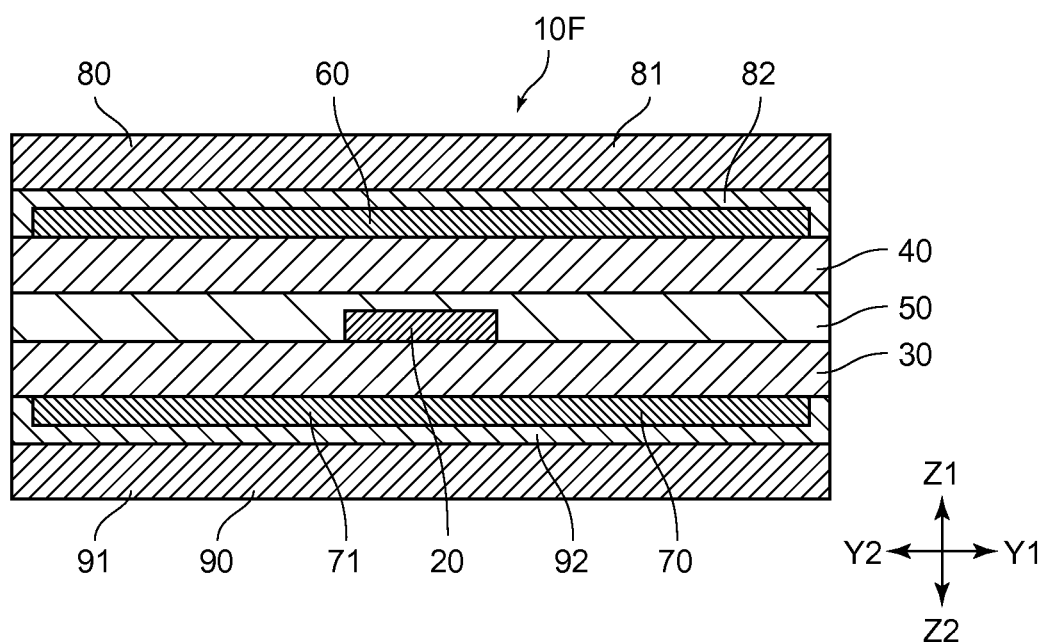
FIG. 30 is a sectional view of the flexible printed circuit board having the conventional configuration, and a view illustrating a state where the board is cut along the line 3-3 in FIG. 28.

Further, a similar test was performed also on a conventional configuration and a comparative example for evaluation. Note that the conventional configuration corresponds to a flexible printed circuit board 10F as illustrated in FIG. 28 to FIG. 30. The flexible printed circuit board 10F has a configuration in which the mesh ground layers 62 and 72 do not exist. Note that FIG. 28 is a plan view illustrating the configuration of the flexible printed circuit board 10F having the conventional configuration. FIG. 29 is a sectional view of the flexible printed circuit board 10F having the conventional configuration, and a view illustrating a state where the board is cut along the line 2-2 in FIG. 28. FIG. 30 is a sectional view of the flexible printed circuit board 10F having the conventional configuration, and a view illustrating a state where the board is cut along the line 3-3 in FIG. 28. Further, the comparative example corresponds to a configuration in which the mesh ground layers 62 and 72 are formed on both of the inner peripheral side and the outer peripheral side of the curved portions PL2 (illustration is omitted).

In the extension/contraction test, the extension of 50% with respect to the entire length of each of the flexible printed circuit boards 10 and 10F was set to be performed, and the test was conducted up to five million times. Further, if the board has the amount of extension within 10% after the test, it was set to pass the test regarding the extension. Further, the test was conducted by using 10 pieces of boards per each structure.

TABLE 1

| | CHARACTERISTIC OF STRUCTURE | PRESENCE / ABSENCE OF DISCONNECTION | PERCENTAGE OF EXTENSION AFTER TEST PERFORMED FIVE MILLION TIMES | CHANGE IN DIRECT CURRENT RESISTANCE | CHANGE IN CHARACTERISTIC IMPEDANCE |
|---|---|---|---|---|---|
| FIRST CONFIGURATION EXAMPLE | "SOLID GROUND ON INNER PERIPHERY + MESH GROUND ON OUTER PERIPHERY" IN ALL OF CURVED PORTIONS | ABSENCE OF DISCONNECTION | 5% OR LESS | 3% OR LESS | 3% OR LESS |
| SECOND CONFIGURATION EXAMPLE | "SOLID GROUND ON INNER PERIPHERY + MESH GROUND ON OUTER PERIPHERY" ONLY IN CURVED PORTIONS ON FRONT SIDE OR REAR SIDE | ABSENCE OF DISCONNECTION | 5% OR LESS | 3% OR LESS | 3% OR LESS |
| CONVENTIONAL CONFIGURATION | SOLID GROUND ON WHOLE SURFACE | PRESENCE OF DISCONNECTION WITHIN 1000 TIMES | 5% OR LESS | OPEN | IMPOSSIBLE TO MEASURE |
| COMPARATIVE EXAMPLE 2 | "MESH GROUND ON INNER PERIPHERY + MESH GROUND ON OUTER PERIPHERY" IN ALL OF CURVED PORTIONS | ABSENSECE OF DISCONNECTION | 5% OR LESS | 3% OR LESS | 10% OR MORE |

As can be understood from the results in Table 1, it was confirmed that the flexible printed circuit board 10 of the first configuration example and the flexible printed circuit board 10 of the second configuration example have a high extension/contraction test endurance, and further, no change in the electrical characteristic is observed in the boards also after the test. Further, it is also confirmed that no change in the characteristic impedance is observed even between before and after the molding, and further, no influence of electrical interference of mutual signal lines 20 is observed.

On the other hand, in the conventional configuration, the disconnection of the signal line 20 occurred in each of the 10 pieces of boards after being subjected to the test, within 1000 times of the test. In the evaluation of the conventional configuration as above, the percentage of extension was 5% or less even in the state of disconnection, the resistance value was OPEN due to the occurrence of disconnection, and the characteristic impedance was impossible to be measured due to the occurrence of disconnection. In the configuration of the comparative example, no disconnection of the signal line 20 occurs, and further, the rate of change in the direct current resistance is 3% or less. However, it was confirmed that the characteristic impedance is changed during the motion of extension/contraction, and the characteristic impedance is changed by 10% or more between when the extension occurs and when the contraction occurs. From the above results, it was confirmed that the conventional configuration cannot be used due to the disconnection, and further, the comparative example also has inferior performance due to the fluctuation of characteristic impedance.

From the above results, it was proved that the flexible printed circuit board 10 of the first configuration example and the flexible printed circuit board 10 of the second configuration example in the present embodiment can realize both of high-quality signal transmission and extension/contraction property.

Regarding Effects

According to the flexible printed circuit board 10 with the configuration as above and the manufacturing method of the flexible printed circuit board 10, the following effects are produced.

Specifically, the curved portions PL2 provided at the plurality of positions in the pleated part PL in the flexible printed circuit board 10 including the strip line transmission path are deformed so as to be opened or closed. Meanwhile, the ground layers 60 and 70 are provided with the mesh ground layers 62 and 72 in which the conductive portions 62a and 72a exist to surround the openings 62b and 72b so that the conductive portions 62a and 72a are formed in the mesh shape, and the solid ground layers 61 and 71 in which the conductive portions are provided in the planar state. Further, the mesh ground layers 62 and 72 are arranged on the outer peripheral side of the curved portions PL2, and the solid ground layers 61 and 71 are arranged on the inner peripheral side of the curved portions PL2.

For this reason, in the curved portions PL2, the mesh ground layers 62 and 72 exist on the outer peripheral side of the curved portions PL2, so that it is possible to reduce the bending stress when molding the flexible printed circuit board 10 into the pleated shape (bellows shape). In addition to that, since the bending stress is reduced, a structure in which a durability when the flexible printed circuit board 10 is repeatedly extended/contracted is also secured, is realized. In particular, by realizing a configuration such that the mesh ground layers 62 and 72 are arranged on the outer peripheral side of the curved portions PL2, and the solid ground layers 61 and 71 are arranged on the inner peripheral side of the curved portions PL2, the mesh ground layers 62 and 72 are easily deformed so as to be compressed. Accordingly, it becomes possible to make the signal line 20 generate a compressive stress, resulting in that the disconnection of the signal line 20 becomes difficult to occur.

Further, in the present embodiment, since the strip transmission path propagating the electromagnetic wave is configured in the flexible printed circuit board 10, the function of blocking the noise from the outside is also not impaired. In particular, in the curved portions PL2, when the solid ground layers 61 and 71 exist on the inner peripheral side of the curved portions PL2, there are no portions having a positional relationship in which the openings 62b and 72b of the mesh ground layers 62 and 72 face each other. Consequently, even if the straight portions PL1 come close to each other in the pleated part PL, it is possible to prevent the electrical interference of mutual signal lines 20, and further, it is also possible to prevent the fluctuation of characteristic impedance in the flexible printed circuit board 10.

Further, in the present embodiment, the mesh ground layers 62 and 72 in the pleated part PL are arranged on the outer peripheral side of the curved portions PL2 in the state of existing on the front surface side and the rear surface side of the signal line 20, in the alternate manner, as described in the first configuration example. Accordingly, the flexible printed circuit board 10 can be easily extended/contracted. Specifically, it becomes possible to improve the extension/contraction property in the flexible printed circuit board 10 of the first configuration example.

Further, in the present embodiment, the mesh ground layers 62 and 72 in the pleated part PL are arranged on the outer peripheral side of the curved portions PL2 in the state of existing on either the front surface side or the rear surface side of the signal line 20, as described in the second configuration example. Accordingly, by using the flexible printed circuit board 10 in the second configuration example at the pivot part of the external device such as the joint or the like of the arms of the robot or the like, it is possible to reduce the stress which acts on the signal line 20 during the motion, and further, the structure capable of withstanding the repetitive motions is realized.

Further, in the present embodiment, each of the insulating layers 30 and 40, and the insulating resin layers 81 and 91 is formed by using the LCP (Liquid Crystal Polymer) being the thermoplastic resin as its material. For this reason, when the heat-molding is performed on the flexible printed circuit board 10 before being subjected to the heat-molding, it becomes possible to easily form the pleated part PL having the plurality of curved portions PL2.

Further, in the present embodiment, it is configured such that the plating coating film for interlayer connection is not formed on the ground layers 60 and 70 positioned at the curved portions PL2. Accordingly, the curved portions PL2 are in a state of being easily bent.

Further, in the present embodiment, the flexible printed circuit board 10 before being subjected to the heat-molding is heat-molded by using the jig 400. Accordingly, by performing the positioning of the tip side of the flexible printed circuit board 10 using the tip fixing member 410, and further, by performing the heat-molding in the state of applying the tension to the flexible printed circuit board 10, it is possible to mold the flexible printed circuit board 10 having a favorable pleated part PL with no positional displacement.

Modified Example

Although one embodiment of the present invention is described as above, the present invention is not limited to this, and can be modified in various ways. This will be described hereinafter.

In the above-described embodiment, only one of the signal line 20 is illustrated. However, the number of the signal line 20 is not limited to one, and two or more of the signal lines 20 may also exist as long as they configure the strip line transmission path.

Further, in the second configuration example in the above-described embodiment, the mesh ground layers 72 are positioned at the curved portions PL2 on the inside diameter side of the pivot part of the external device such as the joint or the like of the arms of the robot or the like. Specifically, it is configured such that the mesh ground layers 62 positioned at the curved portions PL2 on the outside diameter side of the pivot part do not exist. However, it is also possible to adopt a configuration in which the mesh ground layers 62 are arranged on the curved portions PL2 on the outside diameter side of the pivot part. When such a configuration is employed, the curved portions PL2 on the outside diameter side are deformed so as to be largely closed, but, even in that case, the bending is easily performed when compared to the conventional configuration, and further, it is possible to configure such that the disconnection is difficult to occur on the signal line 20.

Note that it is also possible to adopt a configuration, in the first configuration example and the second configuration example, in which the mesh ground layers 62 and 72 are arranged on the inner peripheral side of the curved portions PL2, and the solid ground layers 61 and 71 are arranged on the outer peripheral side of the curved portions PL2. Also in this case, the bending is easily performed when compared to the conventional configuration, and further, it is possible to configure such that the disconnection is difficult to occur on the signal line 20.

Further, in the above-described embodiment, the flexible printed circuit board 10 has the pleated part PL in which the curved portions PL2 each having the same size are arranged at the same pitch. However, the pitch at which the curved portions PL2 are arranged may not be the same, and it is also possible that the curved portions PL2 are arranged at mutually different pitches or at partially different pitches. Further, it is also possible that a size (radius or the like) of one curved portion PL2 is different from a size (radius or the like) of another curved portion PL2. Further, it is also possible that, with respect to a pleated part in which a plurality of curved portions PL2 having a certain size are arranged at a certain pitch, a pleated part in which a plurality of curved portions PL2 whose size is different from the aforementioned size are arranged at a pitch different from the aforementioned pitch is combined.

REFERENCE SIGNS LIST 10, 10F . . . Flexible printed circuit board, 11 . . . Signal pad, 12 . . . Conductive through hole, 12a . . . Through hole, 12b . . . Conductive coating film, 13 . . . GND pad, 14 . . . Conductive through hole, 14a . . . Through hole, 14b . . . Conductive coating film, 15 . . . Conductive coating film layer, 20 . . . Signal line, 21 . . . Receiving land, 30, 40 . . . Insulating layer, 50 . . . Adhesive material layer, 60, 70 . . . Ground layer, 61, 71 . . . Solid ground layer, 62, 72 . . . Mesh ground layer, 62a, 72a . . . Conductive portion, 62b, 72b . . . Opening, 63 . . . Bridge portion, 80, 90 . . . Cover layer, 81, 91 . . . Insulating resin layer, 82, 92 . . . Adhesive material layer, 100 . . . Double-sided copper-clad laminate, 101 . . . Base copper foil layer, 200 . . . Single-sided copper-clad laminate, 201 . . . Base copper foil layer, 300 . . . Lamination adhesive material, 400 . . . Jig, 410 . . . Tip fixing member, 411 . . . Tip receiving part, 412 . . . Hook pin, 420 . . . Jig pin, C1 to C5 . . . Intermediate product, PL . . . Pleated part, PL1 . . . Straight portion, PL2 . . . Curved portion

The invention claimed is:

1. A flexible printed circuit board having at least a set of strip line transmission path by being provided with a signal line, insulating layers covering the signal line from both sides and each made of a thermoplastic resin as its material, and a pair of ground layers facing the signal line with the respective insulating layers sandwiched therebetween, the flexible printed circuit board comprising a pleated part having curved portions molded at a plurality of positions thereof, the curved portions being curved so as to be opened or closed, in the ground layers, mesh ground layers in which conductive portions exist to surround openings so that the conductive portions are provided in a mesh shape, and solid ground layers in which the conductive portions are provided in a planar state, are provided, the mesh ground layers are arranged on an outer peripheral side of the curved portions, and the solid ground layers are arranged on an inner peripheral side of the curved portions.

2. The flexible printed circuit board according to claim 1, wherein:

directions of curves of the curved portions are alternately switched to provide the pleated part to have a bellows shape; and the mesh ground layers are arranged on the outer peripheral side of the curved portions in a state of existing on a front surface side and a rear surface side of the signal line, in an alternate manner.

3. The flexible printed circuit board according to claim 2, wherein the insulating layer is formed by using LCP (Liquid Crystal Polymer) being the thermoplastic resin as its material.

4. The flexible printed circuit board according to claim 2, wherein a plating coating film for interlayer connection is not formed on the ground layers positioned at the curved portions.

5. The flexible printed circuit board according to claim 1, wherein:

directions of curves of the curved portions are alternately switched to provide the pleated part to have a bellows shape; and the mesh ground layers are arranged on the outer peripheral side of the curved portions in a state of existing on either a front surface side or a rear surface side of the signal line.

6. The flexible printed circuit board according to claim 5, wherein the insulating layer is formed by using LCP (Liquid Crystal Polymer) being the thermoplastic resin as its material.

7. The flexible printed circuit board according to claim 5, wherein a plating coating film for interlayer connection is not formed on the ground layers positioned at the curved portions.

8. The flexible printed circuit board according to claim 1, wherein the insulating layer is formed by using LCP (Liquid Crystal Polymer) being the thermoplastic resin as its material.

9. The flexible printed circuit board according to claim 1, wherein a plating coating film for interlayer connection is not formed on the ground layers positioned at the curved portions.

10. A manufacturing method of a flexible printed circuit board having at least a set of strip line transmission path by being provided with a signal line, insulating layers covering the signal line from both sides and each made of a thermoplastic resin as its material, and a pair of ground layers facing the signal line with the respective insulating layers sandwiched therebetween, the manufacturing method of the flexible printed circuit board comprising:

a first step of forming at least one of the signal line on, in a double-sided copper-clad laminate having base copper foil layers on both surfaces of the insulating layer, the base copper foil layer of one surface side;

a second step of laminating, via a lamination adhesive material, a single-sided copper-clad laminate having a base copper-clad laminate on one side of the insulating layer;

a third step of forming through holes on predetermined portions of an intermediate product formed through the second step;

a fourth step of forming conductive through holes by forming conductive coating films on the through holes and a periphery of openings of the through holes;

a fifth step of performing patterning on the base copper foil layers facing the signal line in an intermediate product formed through the fourth step, to form, on a side of either one surface, mesh ground layers in which conductive portions exist to surround openings, and to form, on a side of surface opposite to the one surface, solid ground layers in which the conductive portions are provided in a planar state;

a sixth step of covering at least curved portions to be curved after performing heat-molding, in the mesh ground layers and the solid ground layers, with insulating resin layers via adhesive material layers; and a seventh step of performing, on a flexible printed circuit board before being subjected to the heat-molding formed through the sixth step, the heat-molding in a state where a plurality of portions are curved, and forming, after the heat-molding, a pleated part in which a plurality of curved portions having the mesh ground layers positioned on an outer peripheral side thereof exist.

* * * * *